(12) United States Patent
Ikeda et al.

(10) Patent No.: US 6,498,522 B2
(45) Date of Patent: Dec. 24, 2002

(54) SEMICONDUCTOR DEVICE

(75) Inventors: Hitoshi Ikeda, Kawasaki (JP); Shinya Fujioka, Kawasaki (JP); Yasuharu Sato, San Jose, CA (US); Yasurou Matsuzaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/833,045

(22) Filed: Apr. 12, 2001

(65) Prior Publication Data

US 2001/0021141 A1 Sep. 13, 2001

Related U.S. Application Data

(63) Continuation-in-part of application No. PCT/JP99/05114, filed on Sep. 20, 1999.

(30) Foreign Application Priority Data

Oct. 13, 1998 (JP) ............................................. 10-290811

(51) Int. Cl.[7] .................................................. H03L 7/00
(52) U.S. Cl. ........................ 327/141; 327/99; 327/407; 365/233
(58) Field of Search ............................ 365/233; 327/99, 327/298, 165, 141, 144, 202, 203, 211, 212, 218, 276, 407

(56) References Cited

U.S. PATENT DOCUMENTS

| 5,550,784 | A | | 8/1996 | Takai ......................... 365/233 |
|---|---|---|---|---|
| 5,748,553 | A | | 5/1998 | Kitamura ................ 365/230.03 |
| 5,767,712 | A | | 6/1998 | Takemae et al. ............. 327/152 |
| 5,796,288 | A | * | 8/1998 | Krech, Jr. et al. ............. 327/99 |
| 5,808,961 | A | * | 9/1998 | Sawada ....................... 365/233 |
| 5,838,630 | A | * | 11/1998 | Okajima ..................... 365/233 |
| 5,880,998 | A | * | 3/1999 | Tanimura et al. ............ 365/233 |
| 5,970,020 | A | * | 10/1999 | Ong ........................... 365/233 |
| 5,986,943 | A | * | 11/1999 | Isa ............................. 365/233 |
| 6,002,282 | A | * | 12/1999 | Alfke ......................... 327/165 |

FOREIGN PATENT DOCUMENTS

| JP | 07-037389 | 2/1995 |
|---|---|---|
| JP | 10-003784 | 1/1998 |
| JP | 10-228449 | 8/1998 |
| JP | 11-120768 | 3/1999 |

* cited by examiner

*Primary Examiner*—Tuan T. Lam
(74) *Attorney, Agent, or Firm*—Arent Fox Kintner Plotkin Kahn

(57) ABSTRACT

The invention relates to a clock synchronous type semiconductor device that accepts an input signal inputted from the exterior in synchronization with a clock signal. The semiconductor device according to the invention includes an input signal receiving unit that receives an input signal inputted from the exterior, where the receiving is done in synchronization with a clock signal; a clock timing selecting unit for outputting a clock selecting signal; and a clock generating unit that, in response to receiving a clock selecting signal and an external clock signal, generates a clock signal at a predetermined timing which corresponds to a signal level of the clock selecting signal, and outputs the clock signal to the input signal receiving unit, wherein it is possible to securely accept an input signal regardless of the frequency of the external clock signal.

9 Claims, 16 Drawing Sheets

SEMICONDUCTOR DEVICE

Cross reference to related application. This application is a continuation of International Application No. PCT/JP99/05114, filed Sep. 20, 1999, and designating the United States.

BACKGROUND OF THE INVENTION

1. Field of the Invention

The present invention relates to a clock synchronous type semiconductor device that accepts input signals inputted from the exterior in synchronization with a clock signal.

2. Description of the Related Art

Generally, a semiconductor device such as an integrated circuit, etc., is roughly divided into a logic LSI such as a microcomputer, etc., and a memory LSI such as a DRAM (Dynamic Random Access Memory), etc. The microcomputer has been publicly known as a clock synchronous type semiconductor device. On the other hand, recently, a clock synchronous type has been developed as a synchronous DRAM in the memory LSI.

The synchronous DRAM operates an interface circuit at a high rate in synchronization with an external clock signal inputted from the exterior, and enables writing and reading of data at a high rate. For example, a synchronous DRAM, the maximum operating frequency of which is 100 MHz or more, has been developed.

FIG. 1 shows an example of configuration of an input interface unit in this type of semiconductor device. The input interface unit 1 is provided with a plurality of input signal accepting circuits 3.

The respective input signal accepting circuits 3 accept an external clock signal CLK and an input signal Din (a) (or Din (b)). The input signal accepting units 3 output internal signals Doutz (a), Doutx (a) (or Doutz (b), Doutx (b)) to an internal circuit 5. Also, the internal signal Doutz is an in-phase signal of the input signal Din, and the internal signal Doutx is an antiphase signal of the input signal Din.

The above-described input signal accepting circuits 3 accepts an input signal Din in synchronization with the external clock signal CLK and output the accepted signal into the internal circuit 5 as internal signals Doutz and Doutx.

FIG. 2 shows an example of acceptance timing of an input signal Din in the input interface unit 1 shown in FIG. 1. In this example, the inputting period of the input signal Din is defined in terms of setup time and hold time with respect to rise of the external clock signal CLK.

The setup time tDS is a specification of the minimum time necessary to confirm the input signal Din prior to a rise of the external clock signal CLK, and the hold time tDH is a specification of the minimum time necessary to hold the input signal Din after a rise of the external clock signal CLK.

By inputting an input signal Din in compliance with the above-described timing specification, the input signal Din is accepted by the rise of the clock signal CLK to generate internal signals Doutz and Doutx.

The setup time tDS and hold time tDH are determined so that the input signal Din can be accepted without fail under the worst conditions, taking into consideration the characteristic fluctuations among semiconductor devices, which are produced in a semiconductor fabrication process, and temperature and/or supply voltage to operate the semiconductor devices.

However, it is necessary that users who have this type of a semiconductor device mounted in a system equipment establish an input signal Din, which is inputted into the semiconductor device, prior to the setup time tDS, and designs the timing in the system equipment to hold it longer than the hold time tDH, as described above.

The system equipment needs a circuit to satisfy the setup time tDS and a circuit to satisfy the hold time tDH, respectively, in order to generate input signals Din, so the circuit configuration of the system equipment has been increasing in scale and has been becoming more and more complicated.

In the case of a semiconductor device whose operating frequency exceeds 100 MHz, generally, the cycle of the external clock signal CLK becomes 10 ns or less. Resultantly, the allowance in the timing design at the system equipment is reduced, and it was difficult to generate input signals Din on the basis of the above-described timing specification.

In particular, in order to secure the setup time tDS of an input signal Din, a rise or a fall of an eternal clock signal CLK one clock cycle beforehand needs to be used, wherein the timing design was very difficult where the cycle of the external clock signal CLK is short.

Therefore, the inventors considered outputting an input signal Din from the system equipment as soon as the external clock signal has done transition, generating a clock signal delayed by a predetermined time with the external clock signal CLK in the above-described input interface unit 1, and accepting an input signal Din in synchronization with the clock signal.

FIG. 3 shows a configuration of an input interface unit 1 that has been considered by the inventors. The input interface unit 1 has the above-described input signal accepting circuits 3 and an inverter 7.

The inverter 7 inputs the external clock signal CLK, and outputs an inverted clock signal /CLK of the external clock signal CLK. The input signal accepting circuits 3 inputs the inverted clock signal /CLK. The other configuration is identical to that shown in FIG. 1.

FIG. 4 shows timing for accepting input signals Din in the input interface unit 1 shown in FIG. 3.

The input signal Din is accepted at a rise (=a fall of the external clock signal CLK) of the inverted clock signal /CLK. In this case, the inputting period of the input signal Din is a specification of the setup time tDS1 and hold time tDH1 with respect to the rise of the inverted clock signal /CLK.

Therefore, when the inputting period of the input signal Din can make the time tDS from the rise of the external clock signal CLK to the establishment of data smaller than a ½ cycle of the external clock signal CLK, only the hold time tDH with respect to the rise of the external clock signal CLK need be satisfied.

Resultantly, in the system equipment, users only has to design the timing so that an input signal Din simultaneously generates with the rise of an external clock signal CLK or after the rise thereof, and so that the rise it is held for only the hold time tDH. That is, designing of timings can be facilitated.

FIG. 5 shows the configuration of another input interface unit 1 considered by the inventors. The input interface unit 1 has the above-described input signal accepting circuits 3 and a delay circuit 9.

The delay circuit 9 receives the external clock signal CLK, and outputs a delay clock signal DCLK delayed by a predetermined time to the external clock signal CLK. The respective input signal accepting circuits 3 receives the delay clock signal DCLK. The other configuration thereof is identical to that shown in FIG. 1.

The delay circuit 9 is composed of, for example, a capacitor and a resistor and has a predetermined time constant.

FIG. 6 shows the accepting timing of an input signal Din in the input interface unit 1 shown in FIG. 5.

The input signal Din is accepted at the rise of the delay clock signal DCLK delayed by delay time "Delay" from the rise of the external clock signal CLK. In this, the inputting period of the input signal Din is a specification of the setup time tDS2 and hold time tDH2 with respect to the rise of the delay clock signal DCLK.

Accordingly, when the time tDS from the rise of an external clock signal CLK to the decision of data can be made shorter than the delay time "Delay", the inputting period of an input signal Din only needs to satisfy the hold time tDH of the rise of the external clock signal CLK.

Therefore, in the system equipment, users only need to design the timing so that generating input signal Din simultaneously with the rise of an external clock signal CLK or after the rise thereof as in the input interface unit 1 shown in FIG. 3, and hold the rise of the input signal Din for only the hold time tDH. That is, designing timings can be facilitated.

The considerations made by the inventors are not publicly known so far.

However, in the input interface unit 1 having an inverter 7 shown in FIG. 3, an input signal Din is accepted by using an inverted clock signal /CLK obtained by inverting the external clock signal CLK. Therefore, the timing at which internal signals Doutz and Doutx outputted to the internal circuit 5 delays by almost the half of a clock from the timing of the rise of the external clock signal CLK.

For example, in the case where the input interface unit 1 is applied to an accepting part of address signals and data signals in a clock synchronous type memory LSI such as a synchronous DRAM, etc., the access time such as writing time and reading time delays by one half of a clock.

There is a problem in that, although the delay scarcely influences the access time when the frequency of an external clock signal CLK is high, the influence upon the access time is made large as the frequency of the external clock signal CLK, is lowered.

That is, the access time of a memory LSI to which the input interface unit 1 is applied becomes roughly equivalent to the sum of the time required from the selection of a memory cell of a designated address to the output of the selected memory cell to the exterior and the time of one half of a clock of the external clock signal CLK. Although the former time is almost constant without depending upon the frequency of the external clock signal CLK, the latter time may be lengthened as the frequency of the external clock signal CLK is lowered. Therefore, the longer the cycle of the external clock signal CLK becomes (the lower the frequency becomes), the ratio of one half of a clock of the external clock signal CLK to the access time increases, and the influence thereof upon the access time may be increased.

On the other hand, the input interface unit having a delay circuit 9 shown in FIG. 5 accepts an input signal Din, using a delay clock signal DCLK in which the external clock signal CLK is delayed.

The delay time "Delay" of the delay circuit 9 may fluctuate, due to the characteristic fluctuations among semiconductor devices which are produced in a semiconductor fabrication process, temperature and/or supply voltage when operating the semiconductor device. The fluctuation does not depend on the frequency of the external clock signal CLK.

The higher the frequency of the external clock signal CLK, the larger the influence due to fluctuations of the delay time "Delay". In detail, for example, in the case where the frequency of the external clock signal CLK is 125 MHz (clock cycle is 8 ns) where the delay time "Delay" of the delay circuit 9 fluctuates in a range of 2 ns through 7 ns, the allowance between the maximum value of the delay time "Delay" and the clock cycle is only 1 ns, wherein it becomes difficult to design the internal timing of a semiconductor device.

The above-described malfunction occurs when producing a semiconductor device.

There are two kinds of production processes in the semiconductor devices, one of which is a single wafer process in which a wafer in which a plurality of semiconductor devices are formed by being processed one by one, and the other of which is a batch process in which a plurality of wafers are simultaneously processed. The single wafer process is, for example, a photolithography process, and the batch process is, for example, a heat treatment process.

Generally, in the single wafer process, characteristic fluctuation is liable to occur among semiconductor devices in the same wafer, and in the batch process, characteristic fluctuation is liable to occur in different wafers.

As such fluctuations overlap through a plurality of production processes, the fluctuation of the maximum operating frequency of produced semiconductor devices is subjected to a mountain-like distribution having a peak at the middle, as shown in FIG. 7.

The semiconductor devices are classified into three types, the fastest type, highspeed type and standard type, for example, depending on the maximum operating frequency, through a probe test in the wafer state and a selection test after assembly is completed.

At this time, in the case where the input interface unit 1 having an inverter 7 shown in FIG. 3 is applied to a semiconductor device, influence on the access time is increased in the standard type. The semiconductor devices are handled as defective units where the access time thereof exceeds a predetermined time.

In the case where the input interface unit 1 having a delay circuit 9 shown in FIG. 5 is applied to a semiconductor device, influence due to fluctuations of the delay time "Delay" is increased in the fastest type. Semiconductor devices are handled as defective units where internal signals Doutz and Doutx cannot be accepted by the internal circuit 5.

As a result, an expected yield cannot be obtained, and the production cost of semiconductor devices is remarkably increased.

SUMMARY OF THE INVENTION

It is therefore an object of the invention to provide a semiconductor device that is capable of receiving input signals without fail regardless of the frequency of an external clock signal.

It is another object of the invention to provide a semiconductor device in which the timing of an internal clock signal, which accepts an input signal, is set when the semiconductor device under operation.

It is still another object of the invention to provide a semiconductor device in which the timing of an internal clock signal, which accepts an input signal, is set in a semiconductor fabrication process.

It is yet another object of the invention to provide a semiconductor device in which the timing of an internal clock signal, which accepts an input signal, is automatically set according to the frequency of the external clock signal.

According to one of the aspects of the semiconductor device of the invention, a clock timing selecting unit outputs a predetermined clock selecting signal. A clock generating unit receives a clock selecting signal and an external clock signal and generates a clock signal at a predetermined timing which corresponds to a signal level of the clock selecting signal. The input signal receiving unit receives an input signal in synchronization with the clock signal outputted from the clock generating unit. Therefore, the input signal receiving unit is capable of receiving an input signal (address signal, data signal, etc.,) by means of a clock signal having the optimum timing in response to the frequency, etc., of the external clock signal used. That is, it is possible to accept the input signal without fail regardless of the frequency of the external clock signal.

According to another aspect of the semiconductor device of the invention, a clock generating unit is provided with a plurality of internal clock generators, and the respective internal clock generators generate internal clock signals whose phases are inverted compared to that of the external clock signal, or which are delayed from the external clock signal by a predetermined time. The input signal receiving unit receives an input signal using the selected internal clock signal. Therefore, the input signal receiving unit is capable of receiving an input signal even in the case where the input signal is inputted simultaneously with the edge timing of an external clock signal. Resultantly, it becomes possible to relieve the specified input timing of input signals, wherein the timing design of a system equipment on which the present semiconductor device is mounted can be facilitated.

According to yet another aspect of the semiconductor device of the invention, the first internal clock generator generates an internal clock signal whose phase is inverted compared to the external clock signal. The second internal clock generator generates, by a delay circuit, a delayed internal clock signal which is delayed compared to the external clock signal. The clock generating unit outputs the inverted internal clock signal to the external clock signal, using the first clock generating unit, where the clock selecting signal is one signal level. The clock generating unit generates and outputs a delayed internal clock signal by the delay circuit of the second clock generating unit where the clock selecting signal is the other value. Therefore, for example, by changing the signal level of the clock selecting signal to the one or the other signal level according to a high or low level of the frequency of the external clock signal by means of, for example, the clock timing selecting unit, the input signal receiving unit receives an input signal by the inverted internal clock signal depending on the cycle of the external clock signal where the frequency of the external clock signal is high, and receives an input signal by a delayed internal clock signal that does not depend on the cycle of the external clock signal where the frequency of the external clock signal is low. That is, the input signal receiving unit is capable of accepting an input signal at the optimal and fastest timing in response to the frequency of the external clock signal.

According to yet another aspect of the semiconductor device of the invention, clock selecting information is provided in the selecting information setting unit. The clock timing selecting unit outputs a clock selecting signal according to the clock selecting information. Accordingly, it is possible to set clock selecting information in advance when operating a semiconductor device.

According to yet another aspect of the semiconductor device of the invention, a selecting information unit comprises a register that is able to be set from the exterior. The clock selecting information is set by accessing the register on a system equipment in which the semiconductor device is mounted, for example. The clock timing selection unit outputs a clock selecting signal having a signal level responsive to a storage value of the register. As the result, it is possible to set selecting information in response, to the frequency of the external clock signal in use when operating the semiconductor device, so that users are provided with a semiconductor device having a wide range of operating frequency.

According to still another aspect of the semiconductor device of the invention, the selecting information setting unit is composed of a fuse. The clock selecting information is set by whether or not the fuse in the test process blows. The clock timing selecting unit outputs a clock selecting signal of a signal level according to whether or not the fuse blows. Therefore, for example, the clock selecting information that is optimal for a produced semiconductor device can be set by blowing and not blowing the fuse in accordance with the maximum operating frequency evaluated in a probe test.

According to yet another aspect of the semiconductor device of the invention, the selecting information setting unit is composed of a bonding pad and bonding wire. The clock selecting information is set by changing the connection port of the bonding wire connected to the bonding pad in the assembly process. The clock timing selecting unit outputs a clock selecting signal of a signal level according to a voltage value given to the bonding wire connected to the bonding pad through the bonding wire.

According to yet another aspect of the semiconductor device of the invention, the selecting information setting unit is composed of a conductive layer formed at a predetermined position on a semiconductor substrate corresponding to the pattern of a photo mask. The clock selecting information is set by changing the photo mask used in a semiconductor fabrication process. The clock timing selecting unit outputs a clock selecting signal of a signal level corresponding to the voltage value at the connection port of the conductive layer. Since the clock selecting information is set in the photolithography process and etching process which are in the normal semiconductor fabrication process, the clock electing information is set without the provision of any special process.

According to yet another aspect of the semiconductor device of the invention, the clock timing selecting unit is provided with a frequency detector that detects the frequency of the external clock signal. The clock timing selecting unit automatically selects the internal clock signal according to the frequency of the detected external clock signal. Resultantly, in the semiconductor fabrication process, it is unnecessary to set the clock selecting information, or, it is unnecessary to set the clock selecting information to a system equipment having a semiconductor device mounted thereon.

BRIEF DESCRIPTIONS OF THE DRAWINGS

The nature, principle, and utility of the invention will become more apparent form the following detailed description when read in conjunction with the accompanying drawings in which like parts are designated by identical reference numbers, in which FIG. 1 is a configurational view showing an input interface unit in a prior art semiconductor device;

DESCRIPTION OF THE PREFERRED EMBODIMENTS

EMBODIMENT 1

Hereinafter, a detailed description is given of an example in which the invention is applied to a clock synchronous type memory LSI, with reference to the accompanying drawings.

Figure 8:
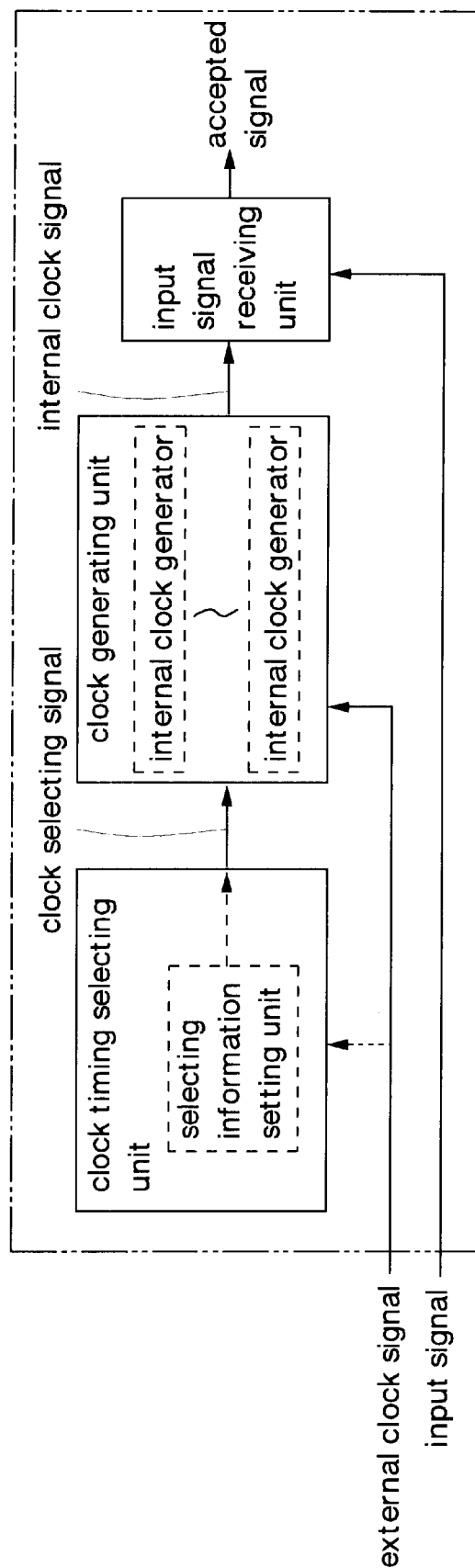
FIG. 8 is a view showing the principle configuration of the first embodiment of the invention.

FIG. 8 shows the principle configuration of the first embodiment of the invention.

The semiconductor device is provided with an input signal receiving unit that accepts an input signal inputted from the exterior in synchronization with a clock signal, a clock timing selecting unit that outputs a clock selecting signal, and al clock generating unit that generates an internal clock signal of a predetermined timing in response to a signal level of a clock selecting signal upon accepting the clock selecting signal and an external clock signal, and outputs the internal clock signal to the input signal receiving unit. The clock generating unit is provided with a plurality of internal clock generators that generate predetermined internal clock signals in response to the clock selecting signal. The clock timing selecting unit is provided with a selecting information setting unit that sets clock selecting information. The clock selecting signal is generated according to the clock selecting information.

In the semiconductor device, the internal clock generators are selected by a clock selecting signal generated according to the selecting information setting unit, and the internal clock signal of a predetermined timing is generated. Therefore, the input signal receiving unit is capable of accepting input signals (address signal, data signal, etc.,) by the clock signal having the optimum timing in response to the frequencies, etc., of the external clock signal that will be used.

Figure 9:
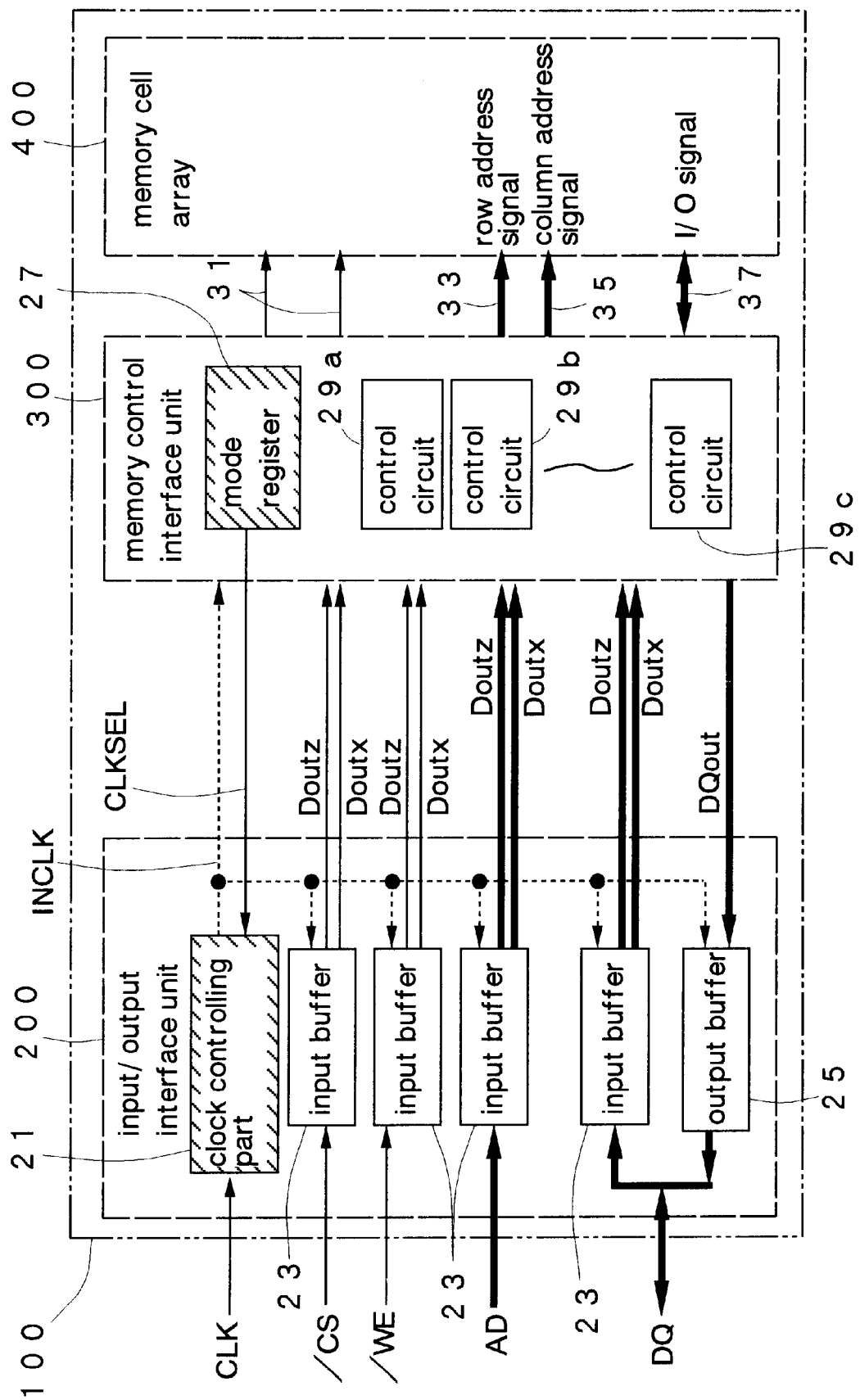
FIG. 9 is a view showing the entire construction of the first embodiment of a semiconductor device according to the invention.

FIG. 9 shows the entire construction of a semiconductor device according to the invention.

The semiconductor device 100 according to the embodiment is composed of an input/output interface unit 200, a memory control interface unit 300, and a memory cell array 400.

The input/output interface unit 200 receives control signals such as the external clock signal CLK, a chip selecting signal /CS, a write enable signal /WE, etc., and an address signal AD and a data signal DQ. Also, the data signal DQ is an input/output signal. Signals other than the data signals DQ are input signals. In addition, the address signal AD and the data signal DQ, which are shown by thick lines in the same drawing, are bus signals consisting of a plurality of lines.

These signals are supplied from the exterior of the semiconductor device 100 to respective circuits of the input/output interface unit 200 via a lead frame, bonding wires, and bonding pads, which are not illustrated in the drawing.

The input/output interface 200 is composed of a clock controlling part 21, a plurality of input buffers 23 and output buffer 25.

The clock controlling part 21 receives the external clock signal CLK from the exterior, and outputs the internal clock signal INCLK shown by a broken line in the drawing to the respective input buffers 23, output buffers 25, and memory control interface unit 300.

The input buffers 23 respectively input the chip selecting signal /CS, the write enable signal /WE, the address signal AD and the data signal DQ, and output the internal signals Doutz and Doutx corresponding to the respective signals to the memory control interface unit 300. Further, the internal signal Doutz is an in-phase signal of the input signal, and the internal signal Doutx is antiphase signal of the input signal.

The output buffers 25 input a data signal DQout from the memory control interface unit 300, and output the data signal DQ to the exterior.

The memory control interface unit 300 is composed of a mode register 27 that sets operation modes of the semiconductor device 100, and a plurality of control circuits 29 that control the timing of the entirety of the semiconductor device 100. The mode register 27 corresponds to the selecting information setting unit shown in FIG. 8.

The mode register 27 outputs a clock selecting signal CLKSEL to the clock controlling part 21 of the input/output interface unit 200.

Also, control signals 31, row address signal 33, column address signal 35, and I/O signal 37 are connected between the memory control interface unit 300 and memory cell array 400.

The memory cell array 400 has a plurality of memory cells (not shown) that are arranged in a matrix. In the embodiment, these memory cells that are the same type as that of a DRAM memory cell are used. One memory cell is composed of one transistor and one capacitor.

In addition, the semiconductor device 100 according to the embodiment is produced, using the CMOS (Complementary MOS) process.

Figure 10:
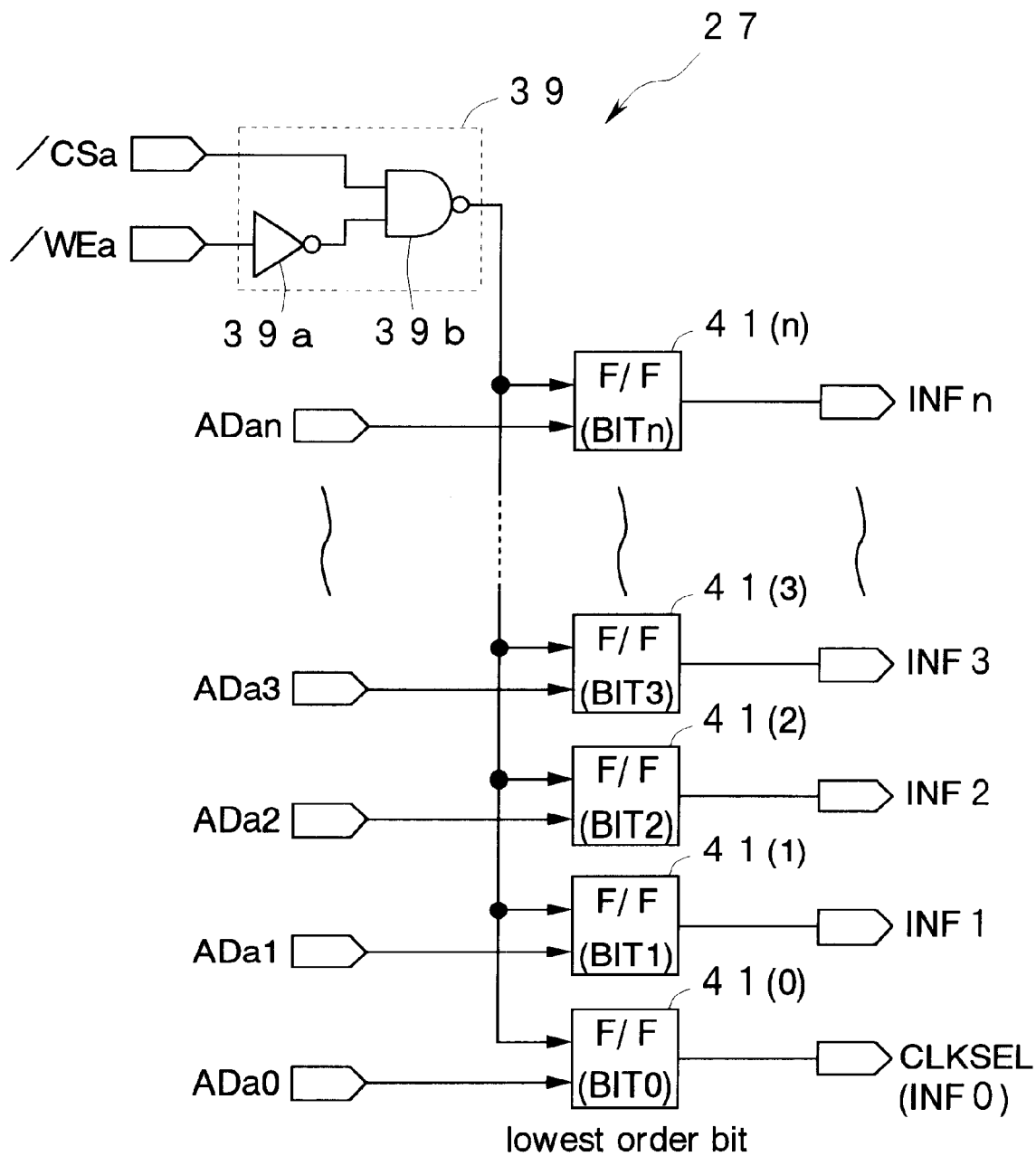
FIG. 10 is a circuit diagram showing a mode register.

FIG. 10 is a circuit diagram showing a mode register 27 of the memory control interface unit 300.

The mode register 27 is composed of a control circuit 39 and a plurality of flip flop circuits 41(0) through 41(n). The flip flop circuits 41(0) through 41(n) correspond to the selecting information setting unit shown in FIG. 8.

The control circuit 39 is composed of an inverter 39a and a NAND gate 39b of two inputs.

The inverter 39a receives a write enable signal /WEa, and the output of the inverter 39a is connected to one input of the NAND gate 39b.

The other input of the NAND gate 39b receives a chip selecting signal /CSa, and the output of the NAND gate 39b is connected to the input of the respective flip flop circuits 41(0) through 41(n).

The chip selecting signal /CSa and the write enable signal /WEa are signals having an inverted logic of the chip selecting signal /CS and the write enable signal /WE.

The flip flop circuits 41(0) through 41(n) are, respectively, capable of holding setting information BIT0 through BITn of 1 bit. In the embodiment, the setting information BIT0 that is at the lowest order bit of the mode register 27 is used to hold clock selecting information.

The respective flip flop circuits 41(0) through 41(n) receive the output signal of the control circuit 39 and address signals ADa0 through ADan, and output information signals INF0 through INFn corresponding to the setting information BIT0 through BITn. In addition, the information signal INF0 is used as the clock selecting signal CLKSEL.

The clock selecting signal CLKSEL is supplied to the clock controlling part 21 of the input/output interface unit 200.

Also, the address signals ADa0 through ADan are signals of the same logic as the address signals AD0 through and.

Information can be set in the flip flop circuits 41(0) through 41(n) when the output of the control circuit 39 is in a low level, that is, when the chip selecting signal /CSa is made into a high level and the write enable signal /WEa is made into a low level.

The level of the address signals ADa0 through ADan at this time is set as setting information BIT0 through BITn, and the setting information BIT0 through BITn is outputted as the information signals INF0 through INFn.

In the embodiment, the output level of the clock selecting signal CLKSEL is set by a system equipment that mounts the semiconductor device 100. Generally, the setting is carried out by the initializing program of the system equipment.

The value set in the setting information BIT0 of the mode register 27 is made into "0" where the frequency of the external clock signal CLK is higher than the predetermined value, and is made into "1" where the frequency of the external clock signal CLK is lower than the predetermined value.

The clock selecting signal CLKSEL is made into a low level where "0" is set in the setting information BIT0 and is made into a high level where "1" is set in the setting information BIT0.

Figure 11:
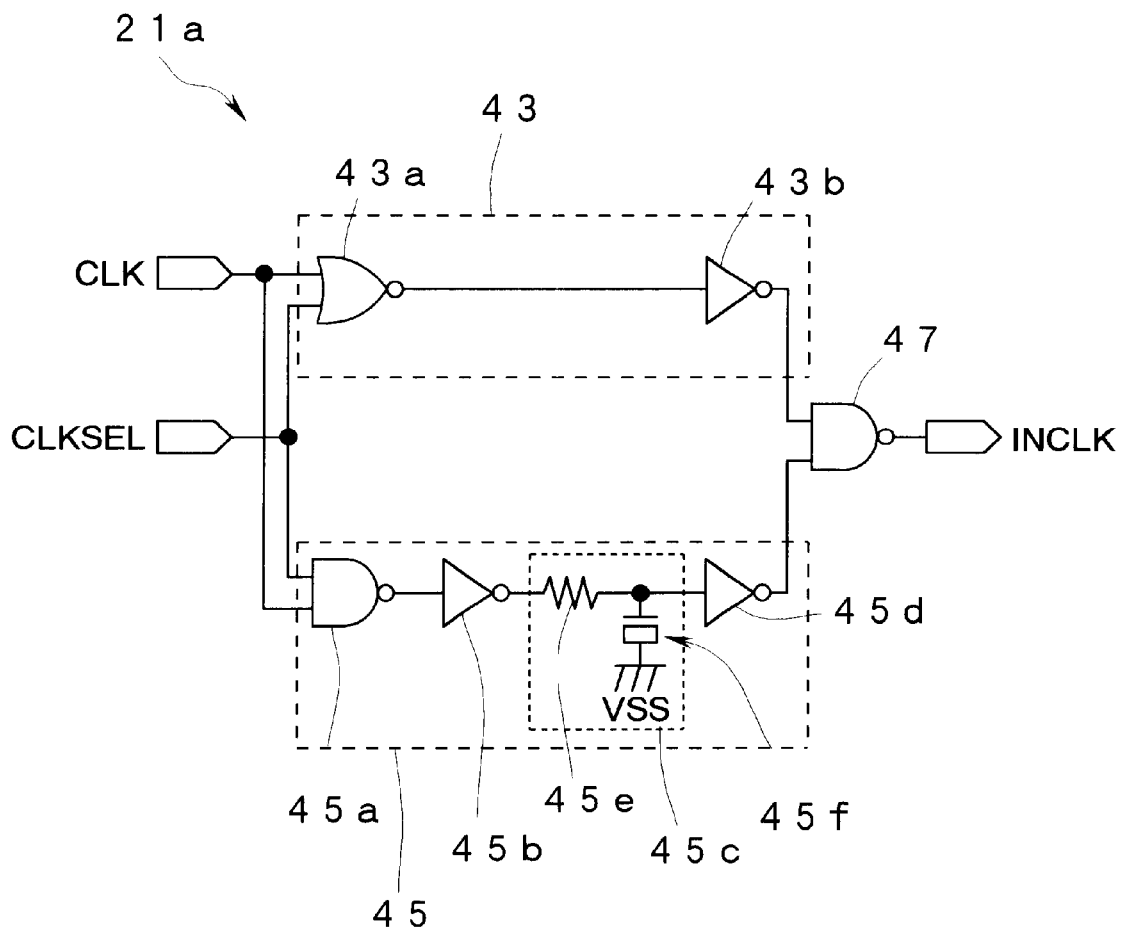
FIG. 11 is a circuit diagram showing a clock generating circuit in a clock controlling part.

FIG. 11 shows a clock generating circuit 21a that generates an internal clock signal INCLK constituted in the clock controlling part 21. The clock generating circuit 21a corresponds to the clock generating unit shown in FIG. 8.

The clock generating circuit 21a is provided with a first internal clock generator 43 and a second internal clock generator 45, which are connected in parallel to each other.

The first internal clock generator 43 is composed so as to connect an inverter 43b to the output of an NOR gate 43a of two inputs.

The second internal clock generator 45 is composed so as to connect an inverter 45b, a delay circuit 45c and an inverter 45d to the output of the NAND gate 45a of two inputs in series.

The delay circuit 45c is composed of a resistor 45e connected to the output of the inverter 45b in series and a capacitor 45f that connects between the output end of the resistor 45e and the ground line VSS.

For example, the resistor 45e is formed by using a n-type diffusion layer, and the capacitor 45f is formed by using a NMOS transistor (hereinafter called an "NMOS"). The NMOS connects a gate electrode (hereinafter called a "gate") to the output end of the resistor 45e, and connects a source electrode (hereinafter called a "source") and a drain electrode (hereinafter called a "drain") to the ground line VSS, thereby constituting the capacitor 45f.

Inputs of the NOR gate 43a of the first internal clock generator 43 and the NAND gate 45a of the second internal clock generator 45, respectively, receives the external clock signal CLK and the clock selecting signal CLKSEL.

The outputs of the inverter 43b of the first internal clock generator 43 and of the inverter 45d of the second internal clock generator 45 are connected to the inputs of the NAND gates 47 having two inputs. The output of the NAND gate 47 is outputted to the respective circuits as an internal clock signal INCLK.

Figure 12:
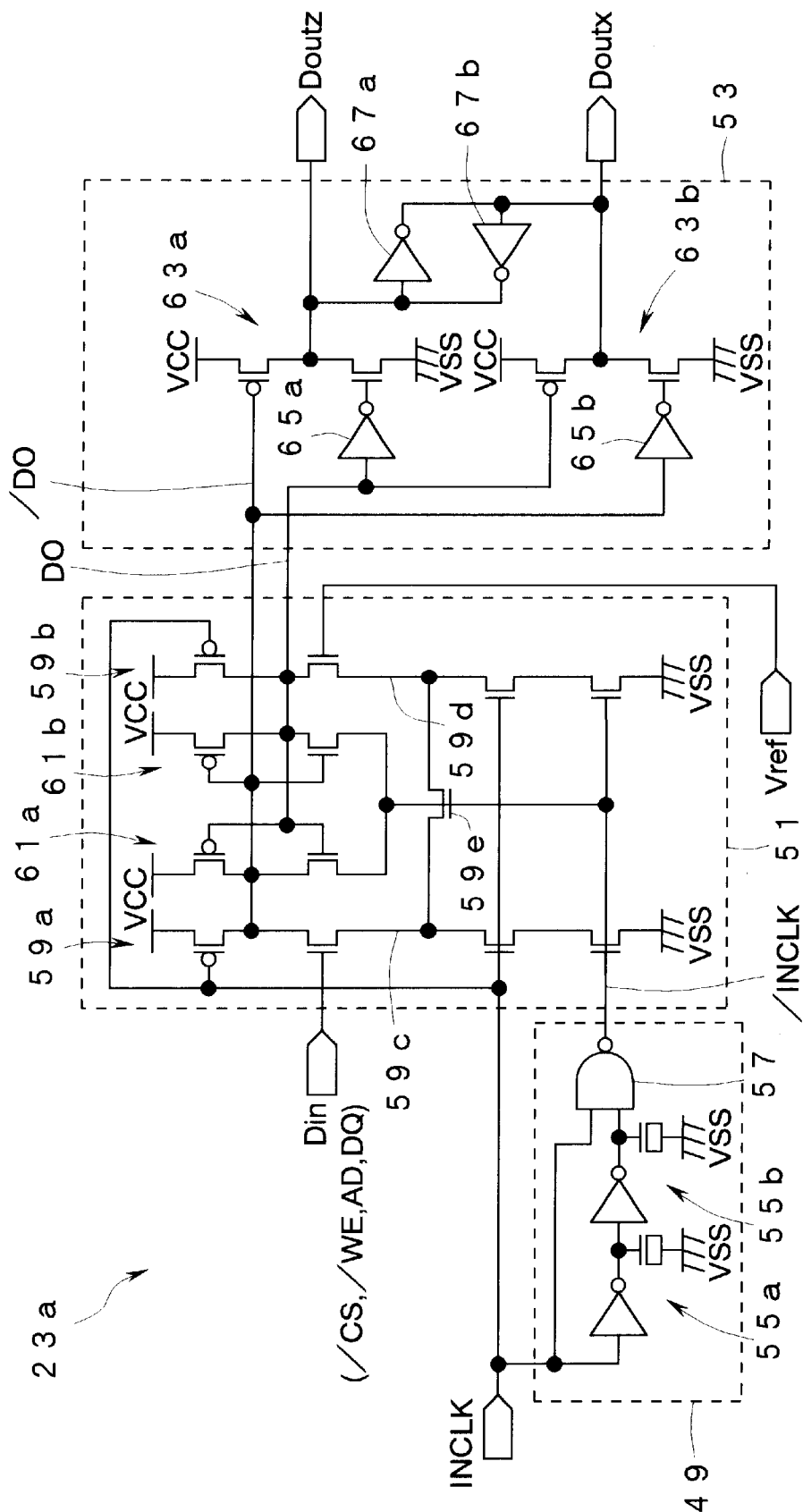
FIG. 12 is a circuit diagram showing an input signal accepting circuit in an input buffer.

FIG. 12 shows a circuit diagram of an input signal accepting circuit 23a that is constructed in the respective input buffer 23 of the input/output interface unit 200. The input signal accepting circuit 23a corresponds to the input signal receiving unit shown in FIG. 8.

The input signal accepting circuit 23a is composed of a control clock generating part 49, an input signal accepting part 51, and an internal signal output part 53.

The control clock generating part 49 is two pairs of delay circuits 55a and 55b, which consist of an inverter and a MOS capacitor, and a NAND gate 57 having two inputs.

The delay circuits 55a and 55b are connected in series, and the output of the delay circuit 55b is connected to one input of the NAND gate 57. The other input of the NAND gate 57 and the input of the delay circuit 55a receive the internal clock signal INCLK.

The output of NAND gate 57 outputs an inverted signal /INCLK. Also, the input signal accepting part 51 is composed of a plurality of PMOS transistors (hereinafter called a "PMOS") and NMOS. The input signal accepting part 51 receives the internal clock signal INCLK, the inverted signal /INCLK, the input signal Din, and a reference signal Vref, and outputs acceptance signals DO and /DO. The acceptance signal DO is an, in-phase signal of the input signal Din, and the acceptance signal /DO is an antiphase signal of the input signal Din.

The input signal accepting part 51 has symmetrically disposed comparing circuits 59a and 59b, in which one PMOS and three NMOSs are connected in series. These comparing circuits 59a and 59b compare the input signal Din with the reference signal Vref in terms of the intensity of voltage values, and generate accepting signals DO and /DO.

Also, the accepting signals DO and /DO are, respectively, outputted from two CMOS inverters 61a and 61b in which an input and an output are alternately connected. The CMOS inverters 61a and 61b are circuits that convert the voltage of the accepting signals DO and /DO to the supply voltage VCC or ground voltage VSS.

Further, the input signal accepting part 51 is provided with an NMOS 59e that equalizes the voltages of the nodes 59c and 59d of the comparing circuits 59a and 59b.

On the other hand, the internal signal output part 53 is composed of two output circuits 63a and 63b consisting of a PMOS and an NMOS, inverters 65a and 65b that are connected to the NMOS gates of the respective output circuits 63a and 63b and receives the accepting signals DO and /DO, and two inverters 67a and 67a in which an input and an output are alternately connected in order to latch the internal signals Doutz and Doutx outputted from the output circuits.

In the semiconductor device described above, as described below, the clock-generating circuit 21a operates upon receiving clock selecting information written in the setting information BIT0 that is the lowest order bit of the mode register 27, and the input signal accepting circuit 23a accepts the input signal Din.

Also, as described above, the output level of the clock selecting signal CLKSEL is set by the system equipment having the semiconductor device 100 mounted therein.

First, in the case where clock selecting information "0" is written in the setting information BIT0 of the mode register 27, the clock selecting signal CLKSEL is made into a low level.

As a result, as shown in FIG. 11, the NOR gate 43a of the first internal clock generator 43 outputs the signal of an inverted logic of the external clock signal CLK. The NAND gate 45a of the second internal clock generator 45 outputs the high-leveled signal regardless of the logic level of the external clock signal CLK.

A signal of an inverted logic of the external clock signal CLK (an inverted internal clock signal) outputted to the NOR gate 43a is outputted as the internal clock signal INCLK through the inverter 43b and NAND gate 47.

That is, the first internal clock generator 43 is activated by making the clock selecting signal CLKSEL into a low level, and the inverted internal clock signal whose phase is inverted with respect to the external clock signal CLK is outputted as the internal clock signal INCLK. At this time, the second internal clock generator 45 is inactivated.

Thereafter, the internal clock signal INCLK is provided to the input signal accepting circuit 23a as shown in FIG. 12.

Next, in the case where clock selecting information "1" is written in the setting information BIT0 of the mode register 27, the clock selecting signal CLKSEL is made into a high level.

As a result, the NOR gate 43a of the first internal clock generator 43 outputs the low-leveled signal regardless of the logic level of the external clock, signal CLK. The NAND gate 45a of the second internal clock generator 45 outputs the signal of an inverted logic of the external clock signal CLK.

And, the signal of an inverted logic of the external clock signal CLK outputted to the NAND gate 45a is outputted as the internal clock signal INCLK (delayed internal clock signal) that is delayed by a predetermined time with respect to the external clock signal CLK, through the inverter 45b, delay circuit 45c, inverter 45d, and NAND gate 47.

That is, the second internal clock generator 45 is activated by making the clock selecting signal CLKSEL into a high level, and the delayed internal clock signal having timing delayed to be almost equivalent to the delay time of the delay circuit 45c with respect to the external clock signal CLK is outputted as the internal clock signal INCLK. At this time, the first internal clock generator 43 is inactivated.

Thereafter, the internal clock signal INCLK is provided to the input signal accepting circuit 23a as shown in FIG. 12.

Figure 13:
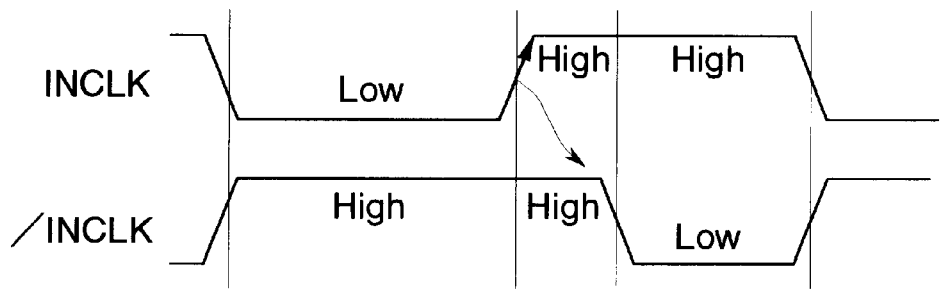
FIG. 13 is a timing diagram showing the internal clock signal and internal clock inverting signal.

As shown in FIG. 13, the control clock generating part 49 of the input signal accepting circuit 23a generates an inverted signal /INCLK that delays the rise timing of the internal clock signal INCLK by a predetermined time.

The input signal accepting part 51 shown in FIG. 12 operates as follows, depending on the status of the internal clock signal INCLK and the inverted signal /INCLK.

First, the input signal accepting part 51 is inactivated when the internal clock signal INCLK is in a low level and the inverted signal /INCLK is in a high level, wherein both the accepting signals DO and /DO are made into a high level.

Next, when both the internal clock signal INCLK and the inverted signal /INCLK are made into a high level, the comparing circuits 59a and 59b are activated. A current responsive to the voltage of the input signal Din and the reference signal Vref is caused to flow into the respective comparing circuits 59a and 59b, wherein the voltage of the accepting signals DO and /DO changes.

That is, when the internal clock signal INCLK is made into a high level, the acceptance of the input signal Din is started.

Next, when the internal clock signal INCLK is made into a high level and the inverted signal /INCLK is made into a low level, the CMOS inverters 61a and 61b are activated, and the voltage of the accepting signals DO and /DO is amplified.

The internal signal output part 53 drives the output circuits 63a and 63b in response to the voltage value of the accepting signals DO and /DO. Then, the internal signals Doutz and Doutx that are responsive to the input signal Din are outputted.

Figure 14:
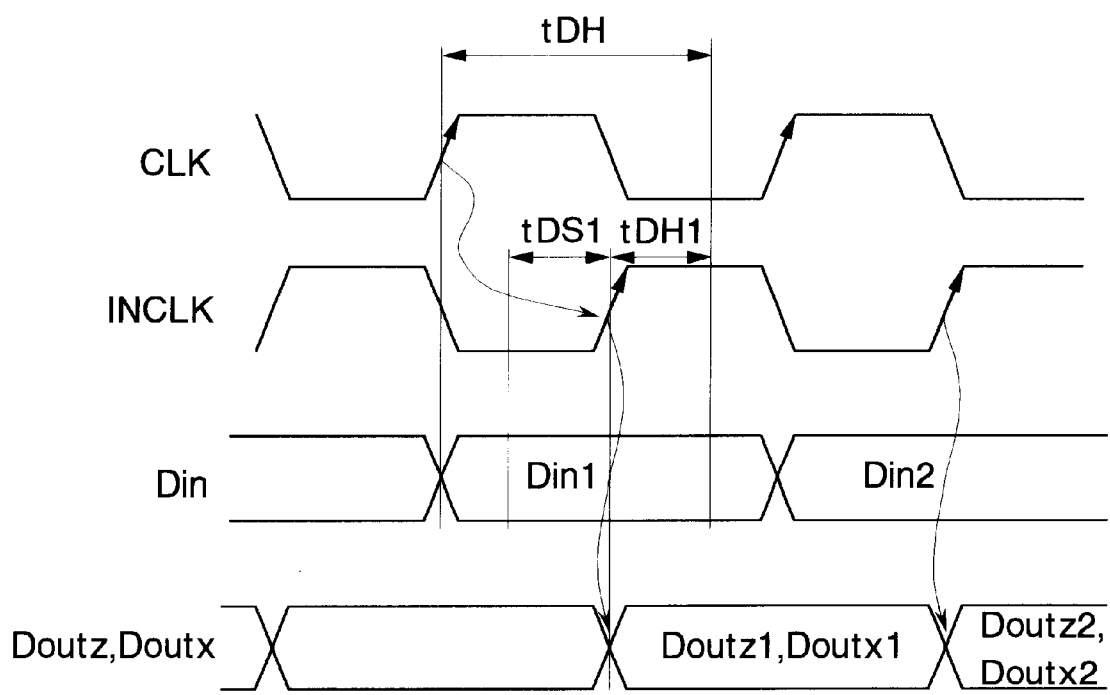
FIG. 14 is a timing diagram showing the accepting of input signals where the clock selecting signal is in a low level.

FIG. 14 shows the accepting timing of the input signal Din when the clock selecting signal CLKSEL is in a low level (that is, where the frequency of the external clock signal CLK is high). The internal clock signal INCLK is the inverted internal clock signal that is obtained by inverting the external clock signal CLK.

The input signal Din is accepted in synchronization with the rise of the internal clock signal INCLK(=the fall of the external clock signal CLK), and the internal signals Doutz and Doutx corresponding to the input signal Din are outputted.

Figure 1:
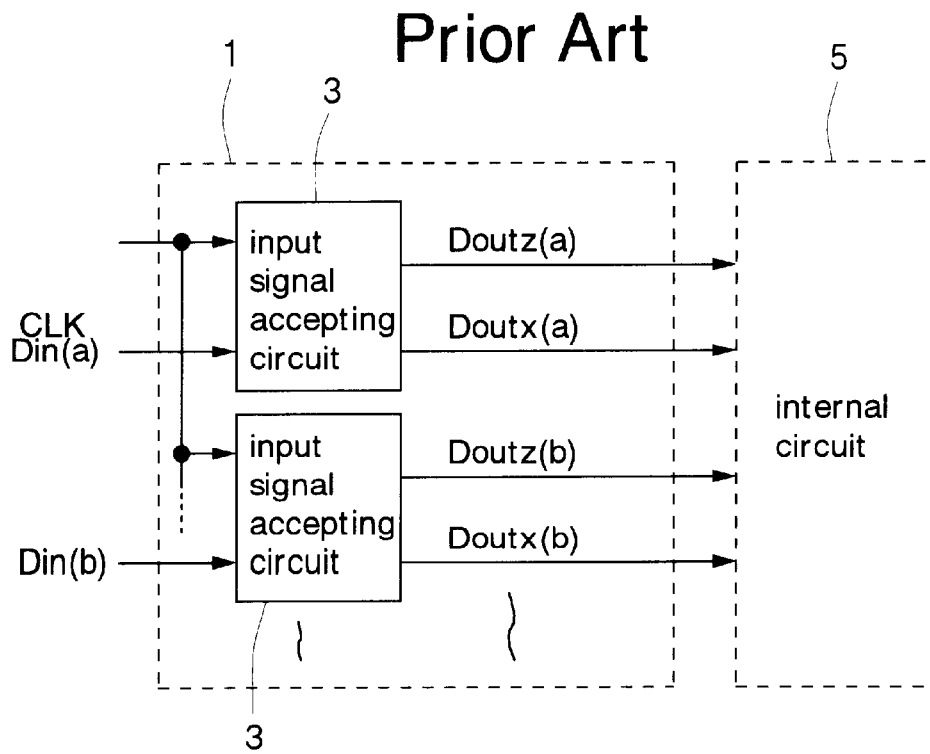
Figure 2:
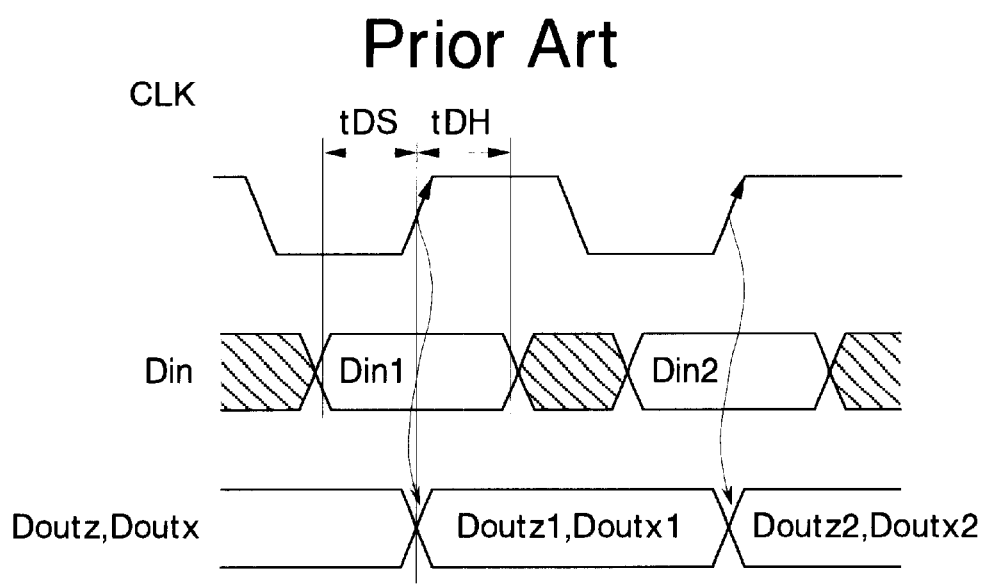
FIG. 2 is a timing diagram showing accepting of input signals in the input interface unit shown in FIG. 1.
Figure 3:
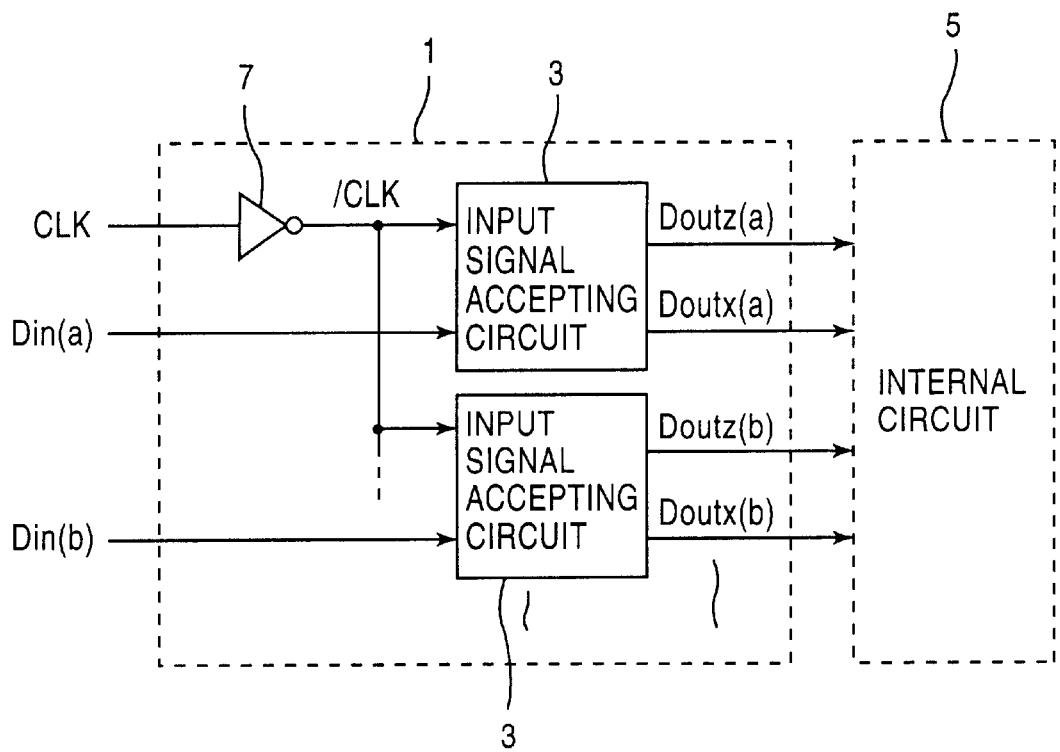
FIG. 3 is a configurational view showing the input interface unit developed by the inventors.
Figure 4:
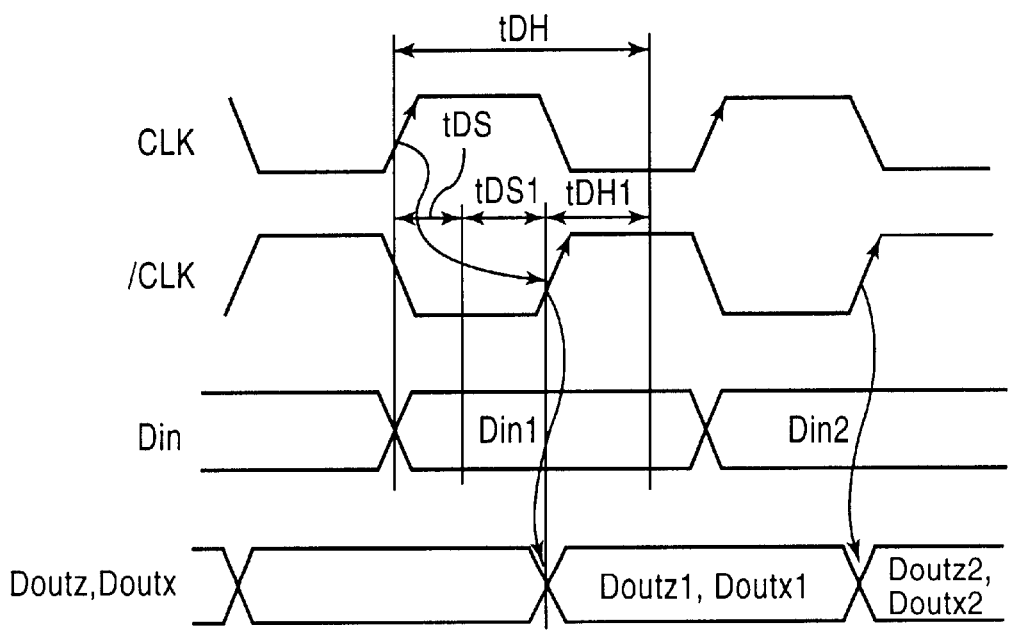
FIG. 4 is a timing diagram showing the accepting of input signals in the input interface unit shown in FIG. 3.
Figure 5:
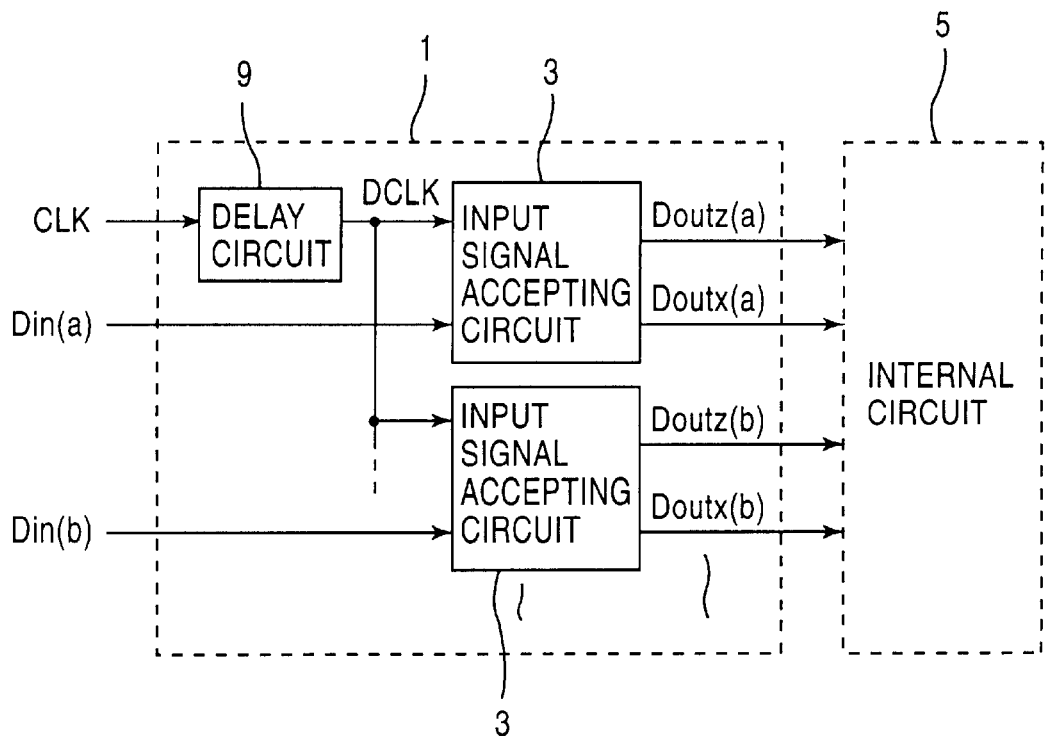
FIG. 5 is a configurational view showing another input interface unit developed by the inventors.

The inputting period of the input signal Din is a specification of the setup time tDS1 and hold time tDH1 with respect to the rise of the internal clock signal INCLK as in FIG. 4 described above.

Figure 15:
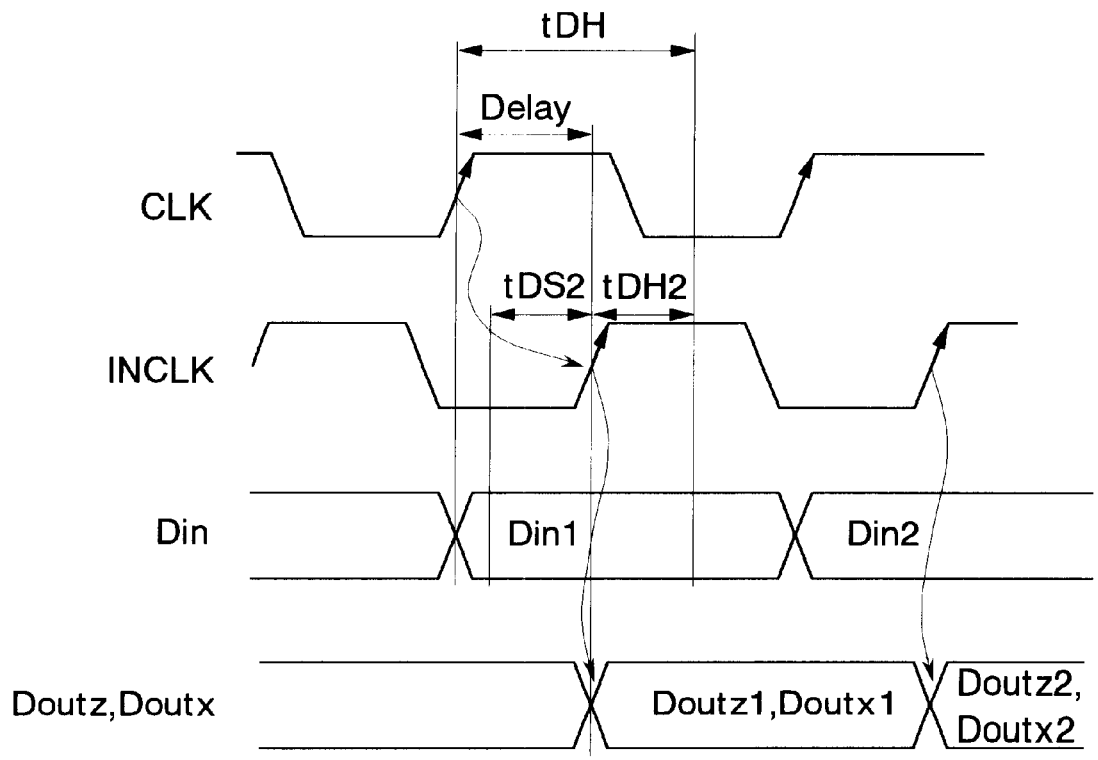
FIG. 15 is a timing diagram showing the accepting of input signals where the clock selecting signal is in a high level.

FIG. 15 shows accepting timing of the input signal Din when the clock selecting signal CLKSEL is in a high level (that is, where the frequency of the external clock signal CLK is low). The internal clock signal INCLK is the delayed internal clock signal that is obtained by delaying the external clock signal CLK by only the delay time "Delay".

The input signal Din is accepted at the rise of the internal clock signal INCLK, wherein the internal signals Doutz and Doutx corresponding to the input signal Din are outputted.

Figure 6:
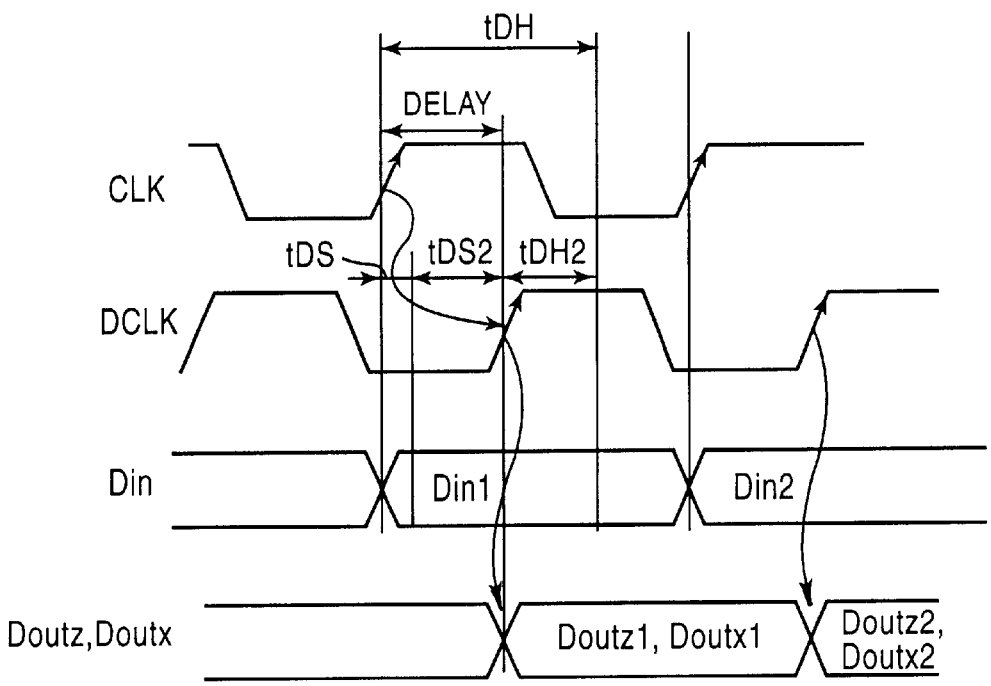
FIG. 6 is timing diagram showing the accepting of input signals in the input interface unit shown in FIG. 5.
Figure 7:
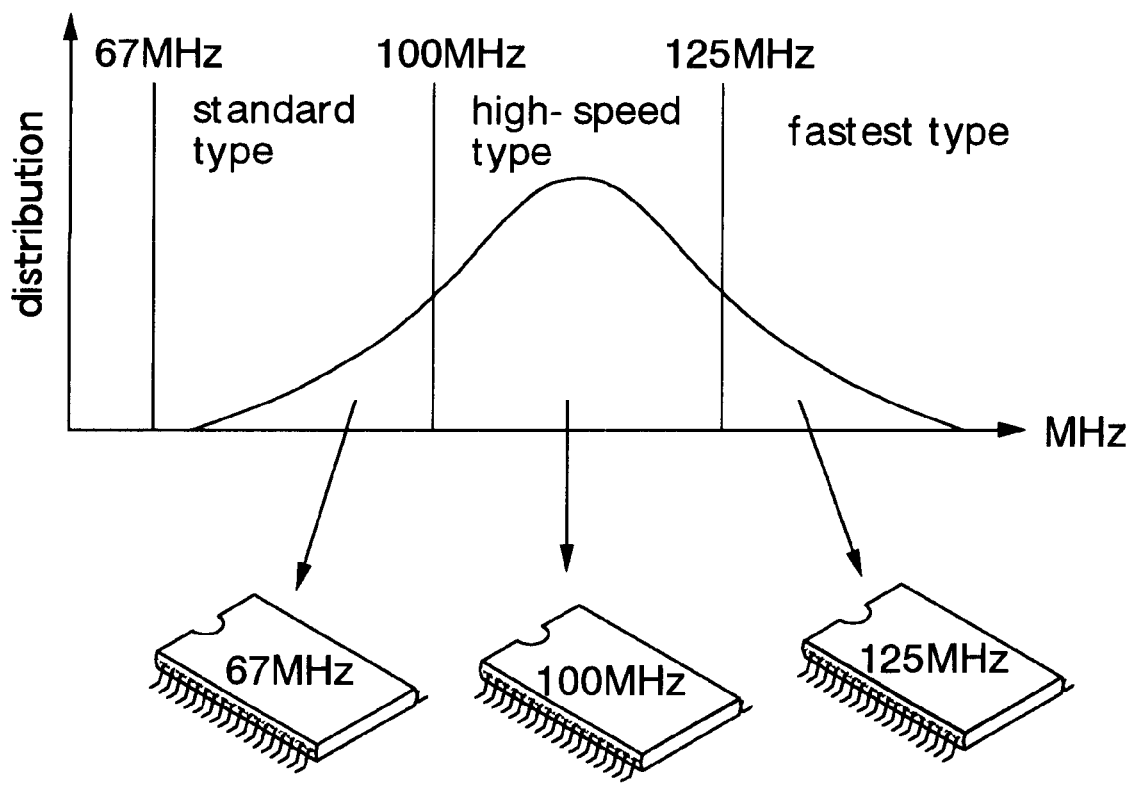
FIG. 7 is a diagram describing an example of fluctuations of the maximum operating frequencies of a plurality of produced semiconductor devices.

The inputting period of the input signal Din is a specification of the setup time tDS2 and hold time tDH2 with respect to the rise of the internal clock signal INCLK as in FIG. 6 described above.

In the embodiment, as shown in FIG. 14 and FIG. 15, the commencement time of the setup time tDS1 and tDS2 is set so as to be delayed from the rise of the external clock signal CLK. As a result, the inputting period of the input signal Din is a specification of only the hold time tDH with respect to the rise of the external clock signal CLK.

In the semiconductor device constructed as described above, the clock generating circuit 21a outputs the internal clock signal INCLK (inverted internal clock signal), which is the inverted signal of the external clock signal CLK, when the frequency of the external clock signal CLK is higher than a predetermined frequency. In addition, the clock generating circuit 21a outputs the internal clock signal INCLK (delayed internal clock signal) whose timing is delayed by delay time "Delay" from the external clock signal CLK, when the frequency of the external clock signal CLK is lower than a predetermined frequency. Therefore, the input signal accepting circuit 23a is capable of accepting the input signal Din by the inverted internal clock signal that is dependant on the cycle of the external clock signal CLK when the frequency of the external clock signal CLK is high, and accepting the input signal Din by the delayed internal clock signal not depending on the cycle of the external clock signal CLK when the frequency of the external clock signal CLK is low. Therefore, the input signal accepting circuit 23a is capable of accepting the input signal Din at the optimal and fastest timing in response to the frequency of the external clock signal CLK. Resultantly, even in the case where the frequency of the external clock signal CLK is low, delay in the access time is held minimum, and in the case where the frequency of the external clock signal CLK is high, the input signal Din can be accepted without fail.

The commencement time of the setup time tDS1 and tDS2 of the input signal Din with respect to the rise of the internal clock signal INCLK was set so as to be delayed from the rise of the external clock signal CLK. Therefore, where the input signal Din is inputted simultaneously with the rise of the external clock signal CLK, it is possible to accept the input signal Din without fail.

Since it is enough that only the hold time tDH being the hold time of the input signal Din is taken into consideration, the definition of the input timing can be relieved further than in the prior arts.

The design of the timing of a system equipment having the semiconductor device mounted therein can be facilitated, and it becomes possible to simplify circuits to output input signals of the system equipment. That is, it is possible to constitute a semiconductor device that can be easily used by users.

Since a clock selecting signal CLKSEL of a predetermined level is generated by a register 27 that can be written from the exterior, clock selecting in formation can be set when operating the semiconductor device. As a result, the user can write data in the register 27 from the system equipment, and it accordingly becomes possible to set clock selecting information.

Also, since it is not necessary to preliminarily set a clock selecting signal CLKSEL in the semiconductor device, it is possible to provide a user with the semiconductor device that can be operated in a wide range of frequencies.

EMBODIMENT 2

Figure 16:
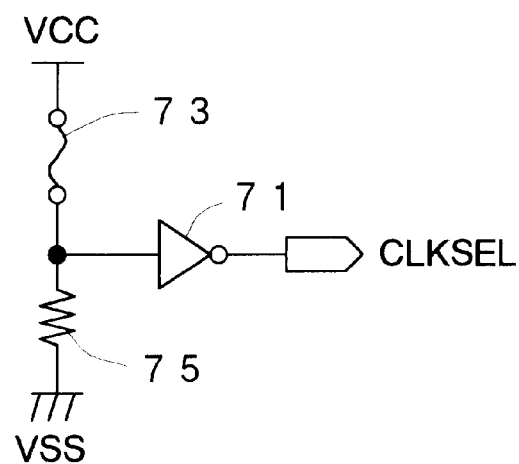
FIG. 16 is a configurational view of circuits showing an example of a selecting information setting unit according to the second embodiment of a semiconductor device of the invention.

FIG. 16 shows an embodiment of the selecting information setting unit, shown in FIG. 8, in the semiconductor device according to the invention. The construction other than the selecting information setting unit is identical to that of the first embodiment described above.

An input of an inverter 71 that outputs a clock selecting signal CLKSEL is connected to one end of a fuse 73 made of polysilicon, etc., and one end of a resistor 75 formed by using a n-type diffusion layer, etc. The other end of the fuse 73 and the other end of the resistor 75 are, respectively, connected to the power supply line VCC and the ground line VSS.

The resistor 75 has a high resistance value to minimize the feed-through current, when the fuse 73 does not blow.

In the semiconductor device according to the embodiment, the maximum operating frequency is evaluated in the probe test or the like in the semiconductor fabrication process, and it is determined whether or not the incorporated fuse 73 blows.

That is, the fuse 73 is not blown out where the maximum operating frequency is a predetermined value or more. At this time, a high leveled signal is inputted into an inverter 71, wherein the clock selecting signal CLKSEL is made into a low level. Therefore, the internal clock signal INCLK becomes an inverted signal of the external clock signal CLK.

On the other hand, the fuse 73 is blown out where the maximum operating frequency is less than a predetermined value. At this time, a low-leveled signal is provided into the inverter 71, wherein the clock selecting signal CLKSEL is made into a high level. Accordingly, the internal clock signal INCLK becomes a signal whose timing is delayed by a predetermined time with respect to the external clock signal CLK.

Therefore, it becomes possible to set an internal clock signal INCLK having the optimum timing in response to the operating frequency of the semiconductor device.

In the semiconductor device according to the embodiment, effects that are similar to those of the first embodiment described above can be brought about. This embodiment is of such a specification that the timing of the internal clock signal INCLK can be varied by the blowing or not blowing of the fuse 73. For this reason, it is possible to set the timing of the internal clock signal INCLK in response to the maximum operating frequency of the semiconductor device evaluated in the probe test, etc.

In addition, since an internal clock signal INCLK of the optimal timing in response to the operating frequency can be selected in the course of the fabrication process, the ratio of generation of defective semiconductor devices due to the internal clock signal INCLK can be lowered, wherein the yield can be further improved. As a result, the production costs thereof can be reduced.

EMBODIMENT 3

Figure 17:
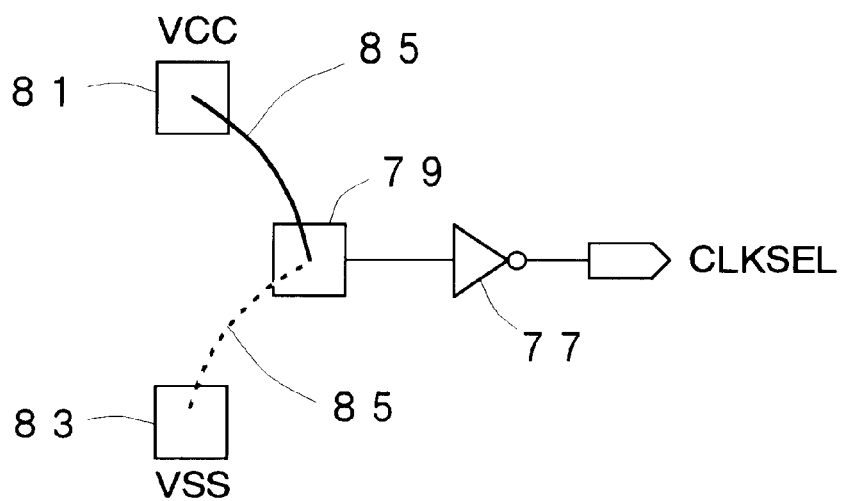
FIG. 17 is a configurational view of circuits showing an example of a selecting information setting unit according to the third embodiment of a semiconductor device of the invention.

FIG. 17 shows an embodiment of the selecting information setting unit, shown in FIG. 8, according to the invention. The construction other than the selecting information setting unit is identical to that of the first embodiment described above.

The input of an inverter 77 that outputs a clock selecting signal CLKSEL is connected to a bonding pad 79. A bonding pad 81 connected to the power supply line VCC and another bonding pad 83 connected to the ground line VSS are arranged in the vicinity of the bonding pad 79.

In the semiconductor device according to the embodiment, the maximum operating frequency of the semiconductor device is evaluated in the probe test of the semiconductor fabrication process, and the bonding pad 79 is connected to the bonding pad 81 or bonding pad 83 in the assembly process.

That is, where the maximum operating frequency is a predetermined value or more, the bonding pad 79 and the bonding pad 81 are connected to each other by a bonding wire 85. At this time, the clock selecting signal CLKSEL is made into a low level.

On the other hand, where the maximum operating frequency is less than the predetermined value, the bonding pad 79 and the bonding pad 83 are connected to each other by the bonding wire 85. At this time, the clock selecting signal CLKSEL is made into a high level.

Also, in the semiconductor device according to the embodiment, effects that are similar to those of the second embodiment described above can be brought about.

EMBODIMENT 4

Figure 18:
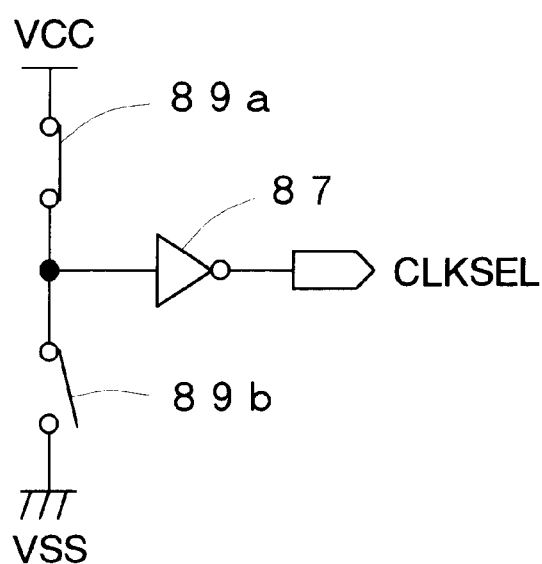
FIG. 18 is a configurational view of circuits showing an example of a selecting information setting unit according to the fourth embodiment of a semiconductor device of the invention.

FIG. 18 shows an embodiment of the selecting information setting unit, shown in FIG. 8, of the semiconductor device according to the invention. The construction other than the selecting information setting unit is identical to that of the first embodiment described above.

The input of an inverter 87 that outputs a clock selecting signal CLKSEL is connected to the power supply line VCC or the ground line VSS via wiring patterns 89a and 89b, which are conductive layers.

The input of the inverter 87 is connected to the power supply line VCC or the ground line VSS, depending on the pattern of a photo mask that is used in the wiring process.

That is, in the embodiment, two photo masks whose pattern differs from each other are prepared. And, the wiring process is carried out by using any one of these photo masks, and the input of the inverter 87 is connected to the power supply line VCC or the ground line VSS via the wiring pattern 89a or 89b.

In further detail, in the photolithography process, a photo-resisting pattern corresponding to the pattern of a photo mask is formed on the semiconductor device. In the etching process, a conductive layer that is preliminarily formed by spattering, etc., is selectively etched by the photo-resisting pattern to form a wiring pattern 89a or 89b.

Wherein the input of the inverter 87 is connected to the power supply line VCC, the clock selecting signal CLKSEL is made into a low level. Where the input of the inverter 87 is connected to the ground line VSS, the clock selecting signal CLKSEL, is made into a high level.

Further, since the wiring patterns 89a and 89b can be normally constructed several tens of micrometers from the input of the inverter 87 to the power supply line VCC or the ground line VSS, the chip area of the semiconductor device will not be increased by the wiring patterns 89a and 89b.

In the semiconductor device according to the embodiment, effects that are similar to those of the second embodiment described above can be brought about. In addition, in the embodiment, since the input of the inverter 87 is connected to the power supply line VCC or the ground line VSS by using photo masks employed in the wiring process, it is possible to change the photo masks in the wiring process in compliance with the number of production when the number of production per operating frequency of the semiconductor devices is found in advance.

Since the level of the clock selecting signal CLKSEL can be changed by only altering the wiring patterns 89 by means of photo masks, it is possible to form the selecting information setting unit without any increase in the chip area of the semiconductor device.

And, by carrying out only the photolithography process and etching process that belong to a normal semiconductor fabrication process except for the photo masks being changed, the level of the clock selecting signal CLKSEL can be changed. No special process is required, and it is possible to select the clock selecting signal CLKSEL.

EMBODIMENT 5

Figure 19:
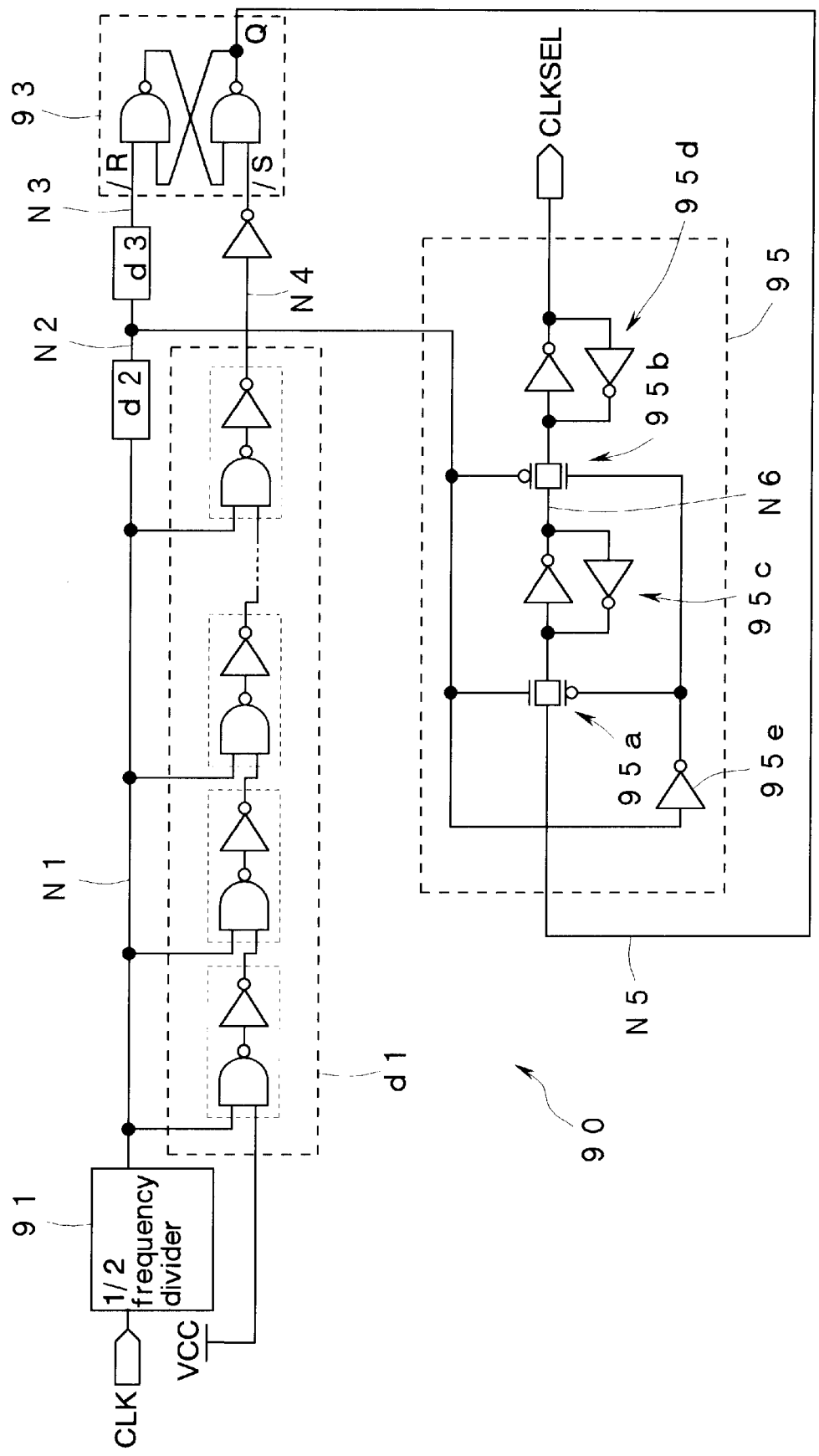
FIG. 19 is a configurational view of circuits showing an example of a frequency detector according to the fifth embodiment of a semiconductor device of the invention.

FIG. 19 shows an embodiment of a frequency detector in the semiconductor device according to the invention. The construction other than the frequency detector (clock timing selecting unit) is identical to that of the first embodiment described above.

A frequency detector 90 is composed of a ½ frequency divider 91 that divides the frequency of the external clock signal CLK into two, a delay circuit d1 that generates a positive pulse signal in synchronization to the rising edge of the input signal, delay circuits d2 and d3 having a predetermined time constant, a latch part 93 consisting of RS flip flop circuits, and a data transfer part 95 that outputs a clock selecting signal CLKSEL.

The input and output of the ½ frequency divider are, respectively, connected to the node of the external clock signal CLK and node N1.

The delay circuit d1 is composed of a plurality of delay stages in which a NAND having two inputs and an inverter are connected in series. One input of the NAND in the initial delay stage is connected to the power supply line VCC. The output of the respective stages is connected to one input of the NAND in the delay stage of the connection port.

The other input of the NAND of the respective delay stages is connected to the node N1. The output of the delay circuit d1 is connected to the node N4.

The input and output of the delay circuit d2 are, respectively, connected to the node N1 and the node N2. The input and output of the delay circuit d3 are, respectively, connected to the node N2 and node N3.

The latch part 93 is composed of two NANDs each having two inputs. The reset terminal /R of the latch part 93 is connected to the node N3, and the set terminal /S thereof is connected to the inverted node of the node N4. The output Q of the latch part 93 is connected to the node N5.

The data transfer part 95 is composed of MOS switches 95a and 95b in which source and drain of PMOS and NMOS are alternately connected, two inverter rows 95c and 95d in which input and output are alternately connected, and an inverter 95e that controls the MOS switches 95a and 95b.

The MOS switch 95a, inverter row 95c, MOS switch 95b and inverter row 95d are connected in series. The node N6 connects the inverter row 95c to the MOS switch 95b.

The input of the MOS switch 95a is connected to the node N5, and the output of the inverter row 95d is connected to the clock selecting signal CLKSEL.

Further, the NMOS gate of the MOS switch 95a and the PMOS gate of the MOS switch 95b are connected to the node N2. The PMOS gate of the MOS switch 95a and the NMOS gate of the MOS switch 95b are connected to the inverted node of the node N2. The delay circuit d1 adjust the set timing of the latch part 93. The delay circuit d2 adjusts the acceptance timing of transfer data of the data transfer part 95.

Figure 20:
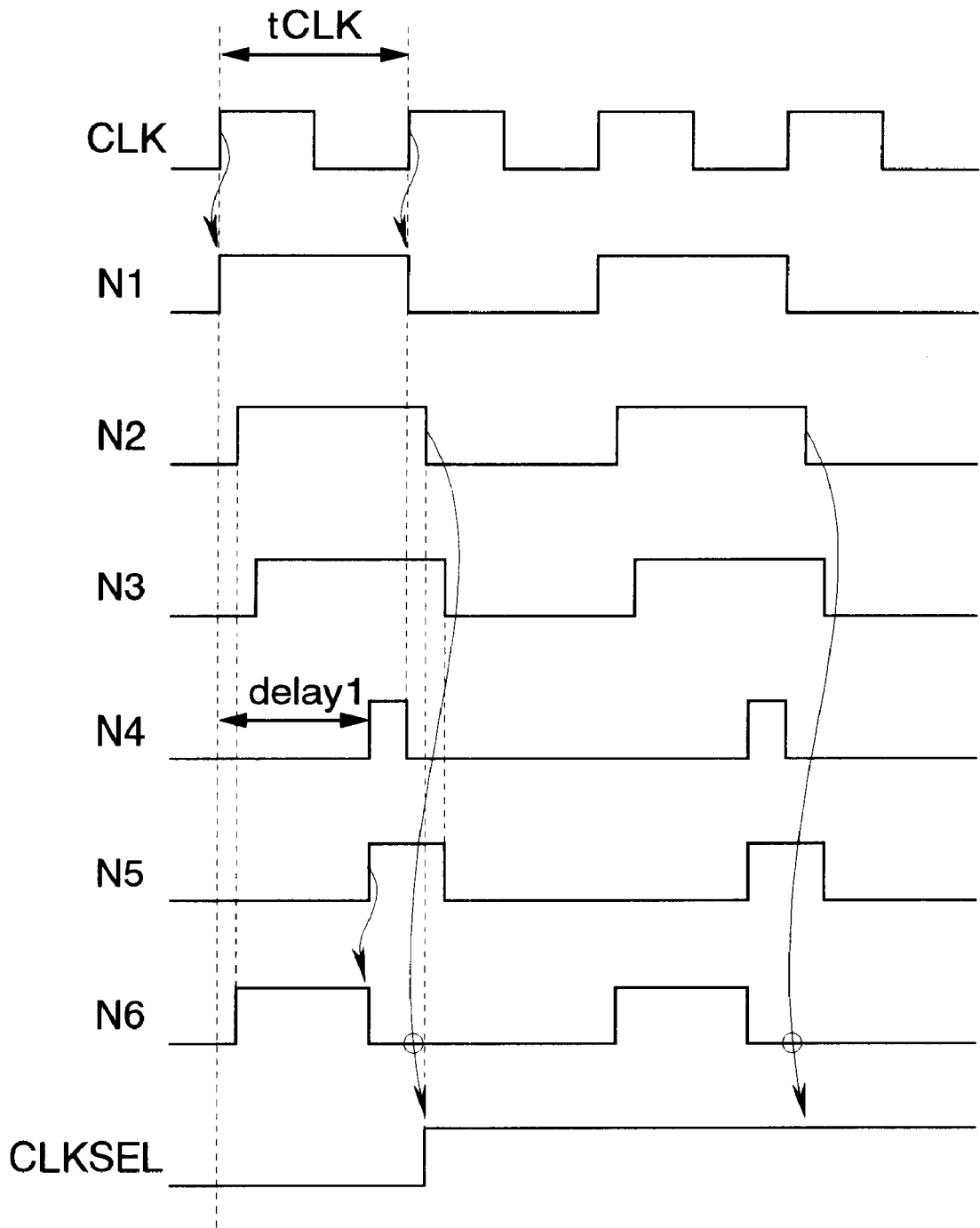
FIG. 20 is a timing diagram showing an action of the frequency detector shown in FIG. 19.
Figure 21:
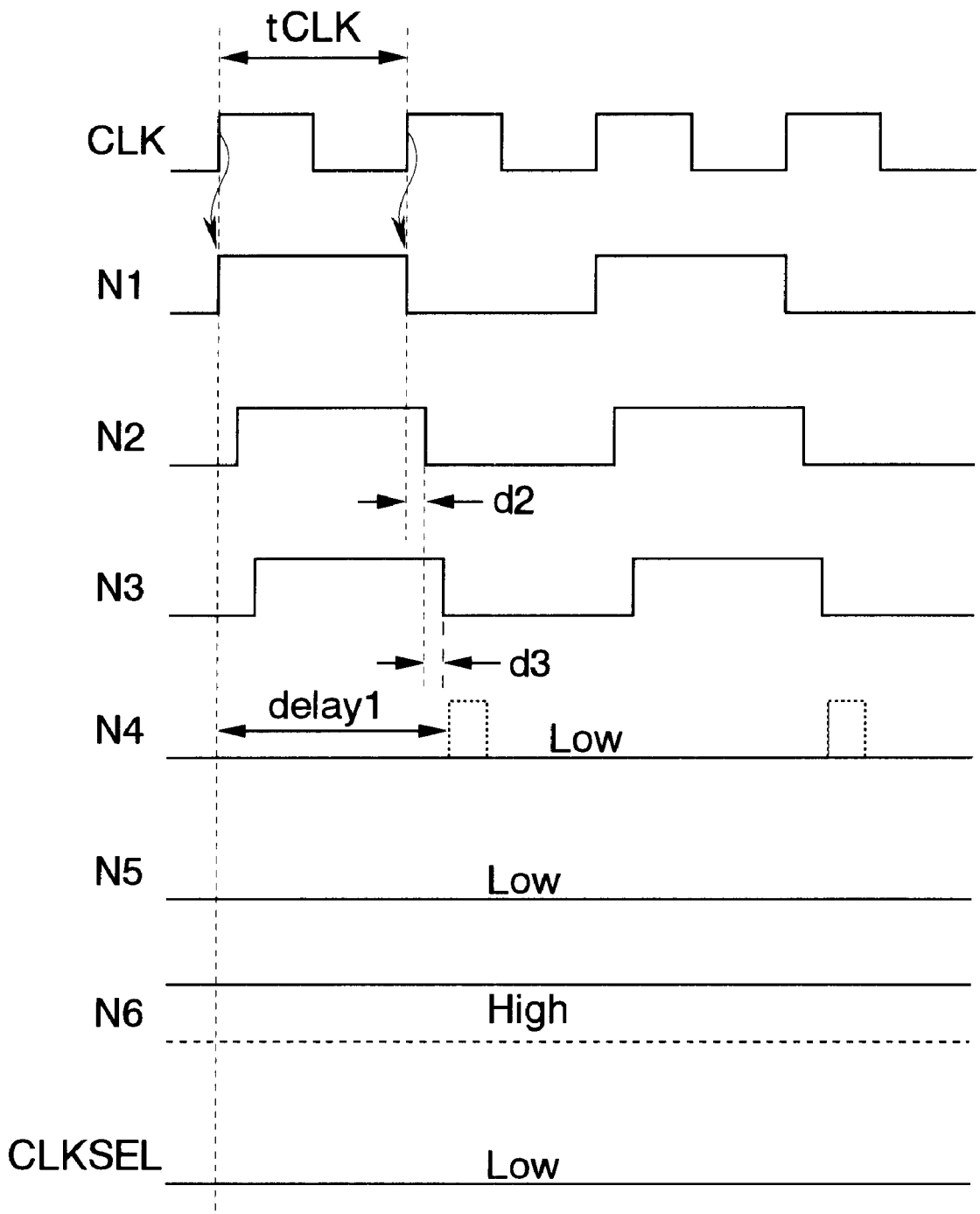
FIG. 21 is a timing diagram showing another action of the frequency detector shown in FIG. 19.

FIG. 20 and FIG. 21 show the operating timing of the above-described frequency detector 90.

Herein, where the cycle tCLK of the external clock signal CLK is longer than the delay time "Delay1" of the delay circuit d1, that is, where the frequency of the external clock signal CLK is lower than a predetermined value, the frequency detector operates as shown in FIG. 20.

First, the ½ frequency divider 91 outputs a signal having a frequency, which is the half of the frequency of the external clock signal CLK, to the node N1.

Next, the delay circuits d2 and d3 transmit the delay signal, which is delayed by a predetermined time from the signal of the node N1, to the nodes N2 and N3.

Also, since the cycle tCLK of the external clock signal CLK is longer than the delay time "Delay1" of the delay circuit d1, a positive pulse, which is del ayed by delay time "Delay1" from the rise of the node N1, is generated at the node N4.

The latch part 93 receives a pulse of the node N4 and makes the node N5 into a high level. The state of high level of the node N5 is maintained until the node N3 is put at low level and the latch part 93 is reset. Further, the node N6 receives a high level of the node N5 and is made into a low level. The state of a low level of the node N6 is latched at the falling edge of the node N2.

Simultaneously, the inverter row 95d outputs an inverted signal of the node N6, and the clock selecting signal CLKSEL changes from the low level to the high level.

After that, the state of the low level of the node N6 is latched per falling edge of the node N2, and the clock selecting signal CLKSEL always maintain its. high level. As a result, the clock selecting signal CLKSEL is made into a high level when the cycle tCLK of the external clock signal CLK is longer than the delay time of the delay circuit d1.

On the other hand, the cycle tCLK of the external clock signal CLK is shorter than the delay time "Delay1" of the delay circuit d1, that is, when the frequency of the external clock signal CLK is higher than a predetermined value, the frequency detector operates as shown in FIG. 21.

No positive pulse is generated at the node N4 when the cycle tCLK of the external clock signal CLK is shorter than the delay time of the delay circuit d1. Therefore, the latch part 93 is maintained to be reset. The node N5 maintains its low level, and the clock selecting signal CLKSEL maintains its low level.

Therefore, in the embodiment, the level of the clock selecting signal CLKSEL automatically fluctuates in response to the frequency of the external clock signal CLK. And, the internal clock INCLK having the optimal timing is selected by the clock selecting signal CLKSEL.

In the semiconductor device according to the embodiment, effects that are similar to those of the first embodiment described above can be obtained. In the embodiment, since the clock timing selecting unit is provided with a frequency detector 90 that detects the frequency of the external clock signal CLK and a clock selecting signal CLKSEL responsive to the detected frequency can be outputted, it is possible to automatically select an internal clock signal INCLK having the optimal timing in compliance with the frequency of the external clock signal CLK.

Resultantly, in the semiconductor fabrication process, no clock selecting information is required any longer, or it becomes unnecessary to set clock selecting information in a system equipment having the semiconductor device mounted therein.

Also, since the internal clock signal INCLK can be automatically selected in compliance with the operating frequency when operating the semiconductor device, it becomes unnecessary to limit the operating frequency in the semiconductor fabrication process in advance, wherein it is possible to provide a user with a Semiconductor device that is applicable to a wide range of operating frequencies.

Further, in the first through fifth embodiments described above, descriptions were given of the case where the invention is applied to a clock synchronous type of memory LSI.

However, the invention is not limited to such embodiments. The invention is applicable to, for example, a microcomputer or system LSI, or the like. In particular, the invention is effective when it is applied to a semiconductor device having an internal circuit that is not in synchronization with an external clock signal CLK.

Figure 22:
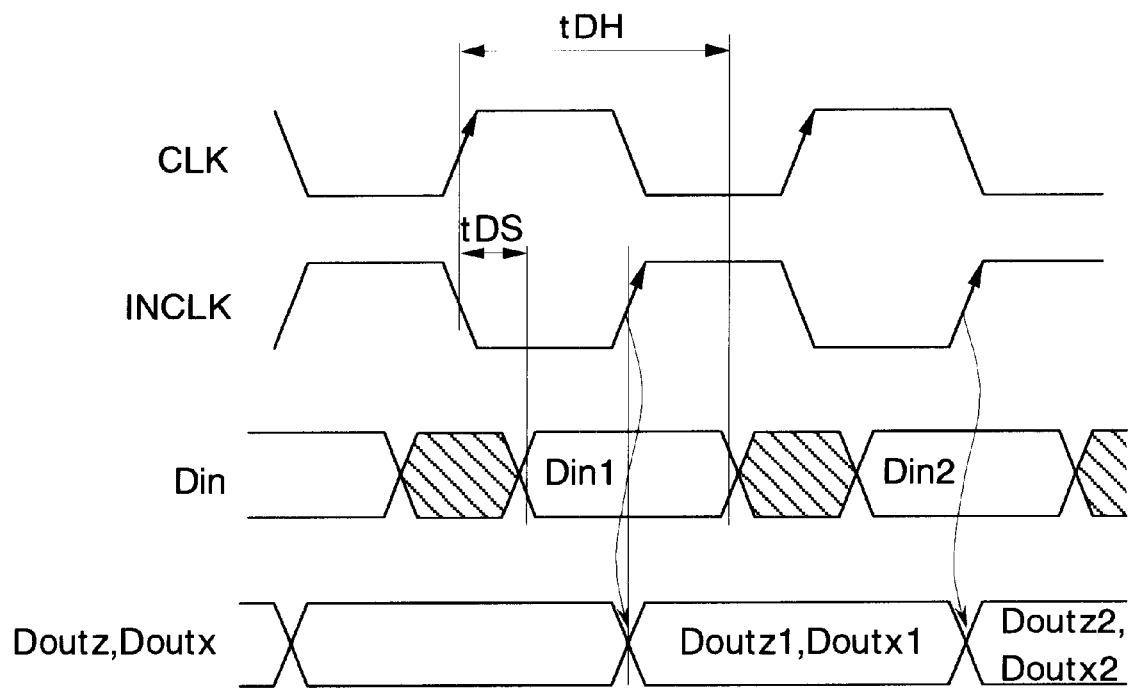
FIG. 22 is a timing diagram showing an example in which setup time tDS with respect to a rise of an external clock signal CLK is defined.

In the first through fifth embodiments described above, descriptions were given of the example in which the accepting timing of the input signal Din is a specification of only the hold time tDH with respect to the rise of the external clock signal CLK. The invention is not limited to such embodiments. For example, as shown in FIG. 22, the accepting timing may be a specification of the setup time with respect to the rise of the external clock signal CLK. In this case, since it is enough that a system equipment having a semiconductor device mounted therein generates an input signal Din almost simultaneous with the rise of an external clock signal CLK, the design of the timing of the system equipment can be further facilitated.

In the first through fifth embodiments described above, descriptions were given of the example in which the clock generating circuit 21a is provided with the first internal clock generator 43 and the second internal clock generator 45. The invention is not limited to such embodiments. For example, the clock generating circuit 21a maybe provided with three or more internal clock generators, and an internal clock signal INCLK may be generated by a plurality of clock selecting information and a plurality of clock selecting signals. In this case, the input signal Din can be accepted at still further finer timing.

In the first through fifth embodiments described above, descriptions were given of the example in which the resistor 45e is composed by using an n-type diffusion layer. The invention is not limited to such embodiments. For example, a p-type diffusion layer may be used instead. Also, wiring such as polysilicon, etc., may be employed.

In the third embodiment described above, a description was given of the example in which the bonding pad 79 and the bonding pads 81 or bonding pad 83 are connected to each other. The invention is not limited to such an embodiment. For example, the bonding pad 79 may be directly connected to a lead frame by a bonding wire.

The invention is not limited to the above embodiments and various modifications may be made without departing from the spirit and scope of the invention. Any improvement may be made in part or all of the components.

What is claimed is:

1. A semiconductor device comprising:

a clock timing selecting unit for generating an internal clock selecting signal, a clock generating unit for generating an internal clock signal which is a signal selected from one of a first timing signal, having a phase inverted from a phase of an external clock, and a second timing signal, delayed by a predetermined time from the external clock signal, said generating done in response to said clock selecting signal; and an input signal receiving unit for receiving an input signal supplied from the exterior, said receiving done in response to said internal clock signal.

2. The semiconductor device according to claim 1, wherein:

said clock generating unit comprises:

a first internal clock generator for generating the first timing signal and outputting the first timing signal as the internal clock signal when said clock selecting circuit is at one signal level; and a second internal clock generator for generating the second timing signal and outputting said clock second timing signal as said internal clock signal when said clock selecting signal is at the other signal level.

3. The semiconductor device according to claim 1, wherein:

said clock timing selecting unit comprises a selecting information setting unit for setting clock selecting information; and said clock selecting signal is outputted according to said clock selecting information that is set by said selecting information setting unit.

4. The semiconductor device according to claim 3, wherein:

said selecting information setting unit comprises a register that is set from the exterior; and said clock timing selecting unit outputs said clock selecting signal according to a storage value of said register.

5. The semiconductor device according to claim 3, wherein:

said selecting information setting unit comprises a fuse; and said clock timing selecting unit outputs said clock selecting signal according to the blowing of said fuse.

6. The semiconductor device according to claim 3, wherein:

said selecting information setting unit comprises a bonding pad and a bonding wire; and said clock timing selecting unit outputs said clock selecting signal according to a voltage value supplied to said bonding pad through said bonding wire.

7. The semiconductor device according to claim 1, wherein:

said clock timing selecting unit comprises a frequency detector for detecting the frequency of said external clock signal; and said frequency detector outputs said clock selecting signal according to the frequency of said detected external clock signal.

8. A semiconductor device comprising:

a clock timing selecting unit for outputting a clock selecting signal;

a clock generating unit for generating a first timing signal and a second timing signal from an external clock signal, the first and second timing signals having a timing difference which varies with frequencies of the external clock signal, and for outputting one of said first and second timing signals as an internal clock signal in response to the clock selecting signal; and an input signal receiving unit for receiving an input signal supplied from the exterior in response to the internal clock signal.

9. The semiconductor device according to claim 8, wherein:

the first timing signal has a phase inverted from a phase of the external clock signal; and the second timing signal is delayed by a predetermined time from the external clock signal.

\* \* \* \* \*